(12) United States Patent
Welna et al.

(10) Patent No.: US 9,859,676 B2
(45) Date of Patent: Jan. 2, 2018

(54) LIGHT SOURCE CONFIGURED FOR STABILIZATION RELATIVE TO EXTERNAL OPERATING CONDITIONS

(71) Applicant: Sharp Kabushiki Kaisha, Osaka (JP)

(72) Inventors: Karl Peter Welna, Abingdon (GB); Edward Andrew Boardman, Abingdon (GB); Tim Michael Smeeton, Oxford (GB); Valerie Berryman-Bousquet, Chipping Norton (GB)

(73) Assignee: Sharp Kabushiki Kaisha, Osaka (JP)

( * ) Notice: Subject to any disclaimer, the term of this patent is extended or adjusted under 35 U.S.C. 154(b) by 82 days.

(21) Appl. No.: 14/974,184

(22) Filed: Dec. 18, 2015

(65) Prior Publication Data
US 2017/0179674 A1 Jun. 22, 2017

(51) Int. Cl.
*H01S 3/109* (2006.01)
*H01S 3/04* (2006.01)
(Continued)

(52) U.S. Cl.
CPC ............ *H01S 3/109* (2013.01); *H01S 3/0405* (2013.01); *H01S 3/08009* (2013.01); *H01S 3/0941* (2013.01); *H01S 3/137* (2013.01)

(58) Field of Classification Search
CPC .... H01S 3/08009; H01S 3/0405; H01S 3/137; H01S 3/0941; H01S 3/109; H01S 3/08072
(Continued)

(56) References Cited

U.S. PATENT DOCUMENTS 5,446,750 A * 8/1995 Ohtsuka .................. H01S 3/042
372/22
5,644,584 A 7/1997 Nam et al.
(Continued)

FOREIGN PATENT DOCUMENTS

JP 6-265951 9/1994
JP 2007-250800 9/2007

OTHER PUBLICATIONS

Nishimura et al., Japanese Journal of Applied Physics 42, 5079, (2003).
(Continued)

*Primary Examiner* — Tuan Nguyen
(74) *Attorney, Agent, or Firm* — Renner, Otto, Boisselle & Sklar, LLP

(57) ABSTRACT

A laser device includes a light source that emits a source light having a first peak wavelength. A nonlinear optical component performs a frequency conversion process that converts the source light into output light having a second peak wavelength. A stabilization component minimizes a mismatch error constituting a difference between the first peak wavelength and a wavelength for which the frequency conversion process in the nonlinear optical component has a maximum value. The stabilization component may include a housing that is thermally conductive between the light source and the nonlinear optical component to minimize a temperature difference between the light source and the nonlinear optical component. The laser device may include a focusing optical component that focuses the source light to have a convergence half angle that is larger than a convergence half angle that gives maximum output power, thereby increasing an acceptable range of the mismatch error.

17 Claims, 16 Drawing Sheets

(51) Int. Cl.
*H01S 3/08* (2006.01)
*H01S 3/137* (2006.01)
*H01S 3/0941* (2006.01)

(58) Field of Classification Search
USPC .......................................................... 372/21
See application file for complete search history.

(56) References Cited

U.S. PATENT DOCUMENTS

| | | | |
|---|---|---|---|
| 5,999,547 A * | 12/1999 | Schneider | ................. G02F 1/39 |
| | | | 359/330 |
| 8,743,922 B2 | 6/2014 | Smeeton et al. | |
| 2006/0072635 A1 * | 4/2006 | Wang | .................... H01S 3/0014 |
| | | | 372/22 |
| 2011/0134947 A1 * | 6/2011 | Rahum | ............... H01S 3/09415 |
| | | | 372/29.015 |
| 2015/0177593 A1 | 6/2015 | Smeeton et al. | |

OTHER PUBLICATIONS

Tangtronbenchasil et al., Japanese Journal of Applied Physics 45, 6315, (2006).
Ruhnke et al., Optics Letters 40, 2127, (2015).
Tangtrongbenchasil et al., Japanese Journal of Applied Physics 47, 2137, (2008).

* cited by examiner

Fig. 11
(a)
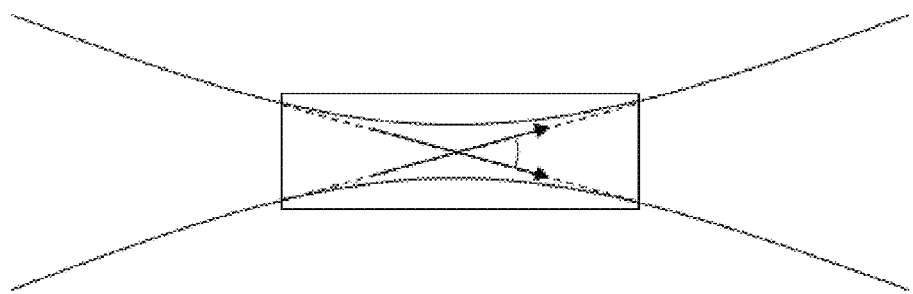
(b)
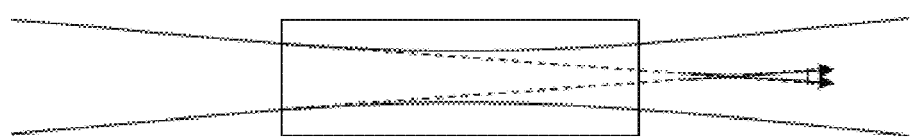
Fig. 12
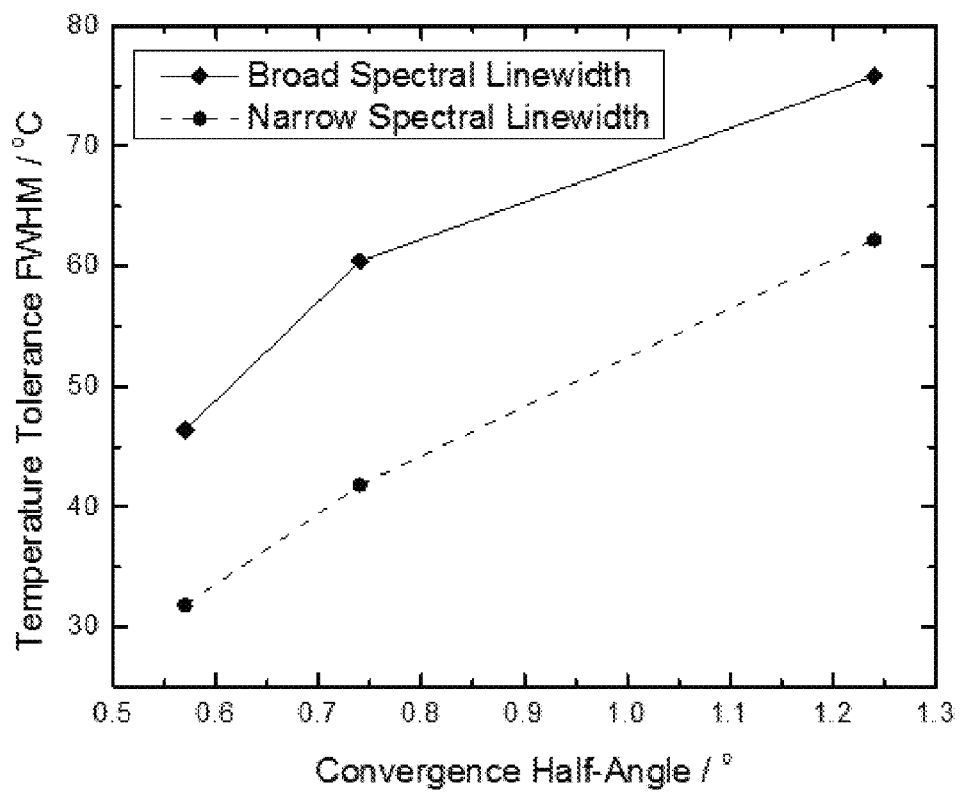

| λ / nm | θ / ° |
|---|---|
| 410 | 87.0 |
| 415 | 78.7 |
| 420 | 75.9 |
| 425 | 73.0 |
| 430 | 70.5 |
| 435 | 68.4 |
| 440 | 66.5 |
| 445 | 64.9 |
| 450 | 63.3 |
| 455 | 61.9 |
| 460 | 60.6 |
| 465 | 59.3 |
| 470 | 58.1 |
| 475 | 57.1 |
| 480 | 56.0 |
| 485 | 55.0 |
| 490 | 54.1 |
| 495 | 53.2 |
| 500 | 52.3 |
| 505 | 51.5 |
| 510 | 50.7 |
| 515 | 50.0 |
| 520 | 49.3 |
| 525 | 48.6 |
| 530 | 47.9 |
| 535 | 47.2 |
| 540 | 46.6 |
| 545 | 46.0 |
| 550 | 45.4 |
| 555 | 44.9 |
| 560 | 44.5 |
| 565 | 43.8 |
| 570 | 43.3 |
| 575 | 42.8 |
| 580 | 42.3 |

LIGHT SOURCE CONFIGURED FOR STABILIZATION RELATIVE TO EXTERNAL OPERATING CONDITIONS

TECHNICAL FIELD

This invention relates to a light source device using frequency-conversion of light from a laser light source for exemplary use to provide a deep ultraviolet light source device which has a wide operable range with respect to changes in operating conditions.

BACKGROUND ART

There are many examples of conventional photonic devices which exploit nonlinear optical properties of materials to convert light of a first frequency to light of a second frequency. Common examples exploit the nonlinear optical properties to provide second harmonic generation (SHG) whereby light with a first frequency emitted by a laser source (a "pump" laser) is converted to light with a second frequency which is double the first frequency. This process is commonly referred to as frequency-doubling. The frequency-doubled light is laser-like, meaning it has many features similar to the characteristics of light emitted by lasers such as narrow range of wavelengths, high beam quality and strong linear polarisation. Photonic devices which emit frequency-doubled light are also often referred to as lasers or frequency-doubled lasers. Frequency-doubling is often used to provide lasers with emission wavelengths which are difficult or impossible to achieve using direct lasing.

The efficiency of frequency-doubling can be sensitive to changes in conditions including the temperature of the frequency-doubling nonlinear optical material and the wavelength of input light. This sensitivity often necessitates use of components to actively stabilise the temperature of one or more components in frequency-doubled lasers which are deployed in situations where the ambient temperature or other conditions may vary. One important category of frequency-doubled lasers are those configured to provide emission of deep ultraviolet (UV) light (that is, light with wavelength between ≈200 nm and ≈300 nm). There is substantial demand for compact, high performance and low-cost light sources of deep UV light, and especially for deep UV light lasers or laser-like sources. The demand is high because deep UV light may be used for efficacious chemical-free disinfection of bacteria and viruses and to enable sensors for chemical or biological compounds owing to characteristic fluorescence, absorption or scattering of the deep UV light. There are no laser diodes available at deep UV wavelengths.

There are examples of conventional devices for generating deep UV light using frequency-doubling of the light emitted by laser diodes. Nishimura et al. [Japanese Journal of Applied Physics 42 p 5079 (2003)] describes a system to frequency-double an input beam with a wavelength of 418 nm using a bulky and complex optical resonator structure to generate an output wavelength of 209 nm. Tangtrongbenchasil et al. [Japanese Journal of Applied Physics 45 p 6315 (2006)] describes a system to frequency-double an input beam with a wavelength of 438 nm using another bulky, complex design with a temperature controller applied directly to the nonlinear optical component (a β-BaB$_2$O$_4$ crystal) to hold the component at a stable temperature to generate 219 nm wavelength. Tangtrongbenchasil et al. [Japanese Journal of Applied Physics 47, p 2137 (2008)] describes a system to frequency-double an input beam with a wavelength of 440 nm from a laser diode using another bulky, complex design in which the temperature of the laser diode is stabilised using a thermoelectric cooler (TEC), which nonetheless yields an output of frequency-doubled light (wavelength 220 nm) with very low optical power (≈200 nW). Ruhnke et al. [Optics Letters 40, p 2127 (2015)] describes a system to frequency-double an input beam with a wavelength of 445 nm to generate a 222.5 nm wavelength output using another bulky, complex design, including an oven to assure stable temperature of the nonlinear optical frequency-doubling component (a β-BaB$_2$O$_4$ crystal) at 50° C. Other features for frequency-doubled lasers capable of emitting deep ultraviolet light using laser diode pump lasers are disclosed in U.S. Pat. No. 8,743,922B2 (Enescu et al., issued on Jun. 3, 2014) and US20150177593A1 (Smeeton et al., published on Jun. 25, 2015).

SUMMARY OF INVENTION

This invention provides a device for generating light through frequency conversion of source light emitted from a laser light source and which is effective over a wide range of operating conditions without the need for active temperature stabilisation of the device. The present invention enables for the first time the manufacture of laser devices which are compact and low cost, at wavelengths where such devices have not previously been realised (e.g. deep ultraviolet wavelengths). In conventional devices it is anticipated that a device which frequency converts laser light, particularly if the output wavelength is in the ultraviolet spectral range, will only maintain an effective power output over a narrow range of operating conditions. This arises because of a wavelength mismatch error between the wavelength of the source light and the wavelength which the nonlinear optical component will frequency convert with good efficiency. Therefore, there has previously been the need to carefully control the operating conditions. For example, the laser light source and/or the nonlinear optical component may be actively temperature controlled. However, this adds complexity and size to the overall device. This invention provides a means of removing the need for such careful control of the operating conditions while still providing a device which maintains an effective power output.

In an aspect of this invention the wavelength mismatch error is reduced by configuring the laser light source and the nonlinear optical component such that the wavelength of the source light emitted from the laser light source and the wavelength which is frequency converted with good efficiency exhibit a similar change for a change in operating condition.

In an aspect of this invention the laser light source is configured such that the wavelength of the source light emitted by the laser light source is stabilised against changes in external operating conditions. This reduces the wavelength mismatch error in situations where the wavelength of the source light changes significantly more than the wavelength which is efficiently frequency converted for the same change in operating condition.

In an aspect of this invention the laser light source and nonlinear optical component are attached to a housing which is configured to provide good thermal contact between the laser light source and nonlinear optical component. This reduces the wavelength mismatch error when operating conditions are changed.

In an aspect of this invention source light which does not undergo frequency conversion is used to heat the nonlinear optical component. This may reduce the wavelength mismatch error when the electrical current supplied to the laser light source and/or the operating mode of the laser light source are changed.

In an aspect of this invention the device is configured such that the source light incident on the nonlinear optical component has a convergence which provides a large acceptable wavelength mismatch error while still allowing the device to be effective. In particular, the present inventors have found that the convergence angle which provides an advantageously large acceptable wavelength mismatch error differs from the convergence angle taught in the prior art for achieving the highest efficiency frequency conversion. In situations where a device is required to be effective over a certain range of operating conditions, it is advantageous to move away from the convergence angle taught in the prior art.

In an aspect of this invention the laser light source is configured to emit light with a broad spectral linewidth. This increases the acceptable wavelength mismatch error and therefore provides a device which is effective over a wider range of operating conditions compared to a device which uses a laser light source which is not configured to emit laser light with a broad spectral linewidth.

An unanticipated new problem arising from the advantageously large operable range provided by aspects of this invention is that the direction and/or position of the frequency converted output light may change when the operating conditions are changed. Therefore, in a further aspect of this invention this change in direction and/or position is reduced by the inclusion of one or more additional optical components.

Any or all of these aspects may also be combined. The aspects of this invention enable a frequency converted light source which:

- remains effective over a wider range of operating conditions than a device which does not use these aspects.
- is lower cost than a device which does not use these aspects because of the relaxation in the control required over the operating conditions (e.g. active temperature stabilisation is not required, thus reducing component number and complexity).
- can be more compact than a device which does not use these aspects for the same reason as above (e.g. active temperature stabilisation is not required, reducing the number of components and therefore the size of the device).

The invention is particularly advantageous for devices which generate deep ultraviolet light (e.g., wavelength between ≈200 nm and ≈300 nm) by second harmonic generation using a laser diode to generate the source light. Demand for light sources which are capable of emitting deep ultraviolet light is increasing and in many applications the capability to remain effective over a wide range of operating conditions is either highly desirable or essential.

BRIEF DESCRIPTION OF DRAWINGS

FIG. 11(a) and FIG. 11(b) show the range of available phase matching directions for (a) a source light with a large convergence half-angle and (b) a source light with a small convergence half-angle.

FIG. 12 shows experimental data on the dependence of temperature tolerance of laser devices according to this invention on the convergence half-angle of the source light incident on the nonlinear optical component for a device with a laser light source configured to emit source light with a broad spectral linewidth and for a device with a laser light source configured to emit light with a narrow spectral linewidth.

DESCRIPTION OF REFERENCE NUMERALS

Figure 1:
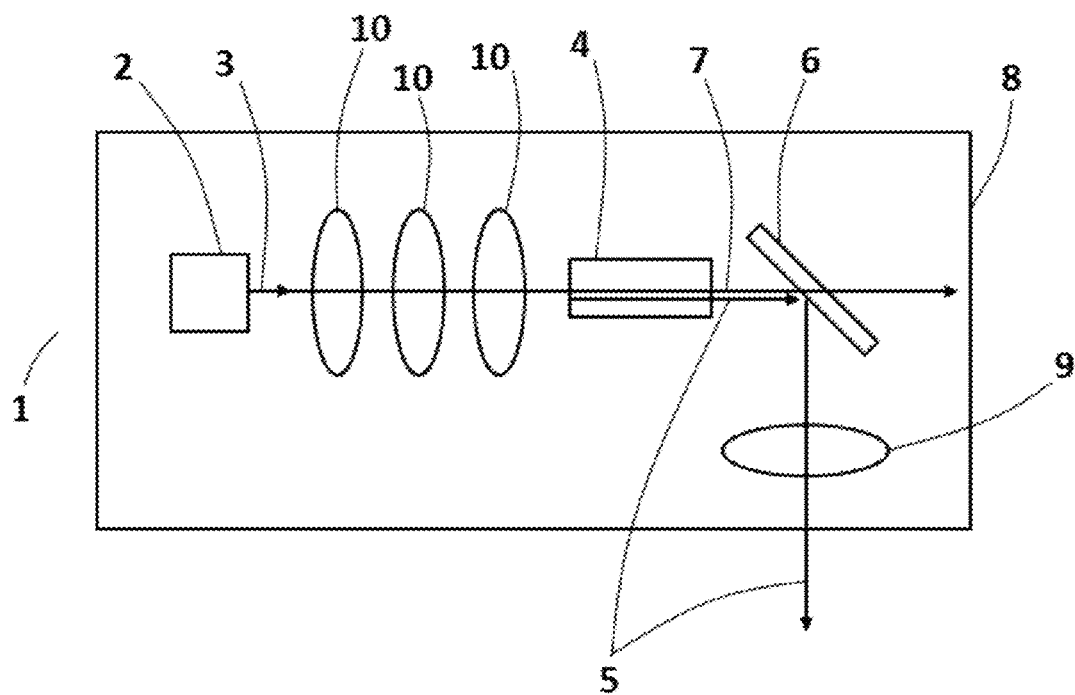
FIG. 1 shows an exemplary laser device according to an aspect of this invention.

1. Device
2. Laser light source
3. Source light
4. Nonlinear optical component
5. Output light
6. Filter
7. Residual light
8. Housing
9. Output optical component
10. Optional optical components
11. Collimating lens
12. First cylindrical lens
13. Second cylindrical lens
20. Heat sink
30. First fixture point
31. Second fixture point
40. Beam folding optical component
50. Light absorbing component
51. Optional additional optical components
60. Optical component
70. Wavelength stabilising component
71. Incident light
72. Optical component
80. Output light beam of a first direction
81. Output light beam of a second direction
82. Output light beam of a third direction
90. Convex lens
91. Diffraction grating
92. Prism
93. Off-axis parabolic mirror
100. Optional thermal resistance-increasing component

DETAILED DESCRIPTION OF INVENTION

The invention provides a device for generating light, for example ultraviolet light, which overcomes impracticalities found in previous conventional devices. In particular, the device of the present invention is effective over a wide range of ambient temperature conditions and/or other operating conditions without the need for active temperature control of the device.

A device according to an aspect of this invention is illustrated in FIG. 1. The device 1 includes a laser light source 2 which emits source light 3, including a range of wavelengths and with a first peak wavelength $\Lambda_{peak,\ source}$, which is incident on a nonlinear optical component 4. The source light 3 may optionally be coupled into the nonlinear optical component by the use of one or more optical components 10. Within the nonlinear optical component 4, the source light 3 undergoes a nonlinear frequency conversion process which generates an output light 5 at least a portion of which has a second peak wavelength different from the first peak wavelength of the source light 3, $\lambda_{peak,\ output} \neq \Lambda_{peak,\ source}$. The nonlinear frequency conversion process may be second harmonic generation (SHG), for which $\lambda_{peak,\ output} \approx \Lambda_{peak,\ source}/2$. The output light may have a peak wavelength which is in the range 200 nm$\leq \lambda_{peak,\ output} \leq$300 nm. Throughout this disclosure, wavelengths refer to the wavelength of light measured when propagating in vacuum where the refractive index is equal to one.

The efficiency of a frequency conversion process in a nonlinear optical component may depend on several factors, including the wavelength of the source light 3, the direction of the source light within the nonlinear optical component (for example with respect to crystal axes of said component, especially if the nonlinear optical component includes optically birefringent material), and the temperature of the nonlinear optical component. For a particular configuration (e.g. a temperature of the nonlinear optical component and a direction of the source light within said component), the efficiency of a frequency conversion process depends on the wavelength of the source light, and the wavelength of the source light for which the frequency conversion process has maximum efficiency is referred to herein as $\Lambda_{PM}$. The efficiency of the frequency conversion process may be a maximum when the source light 3 and the output light 5 propagate within the nonlinear optical component with a constant phase relationship, a condition generally known as a phasematched condition.

The nonlinear optical component 4 is preferably configured such that $\Lambda_{PM} \approx \Lambda_{peak,\ source}$ for an initial design operating condition. For example, the nonlinear optical component is configured such that the frequency conversion process is partially or fully phasematched for an initial design operating condition. This may be achieved by configuring the components such that the direction of propagation of the incident source light 3 inside the nonlinear optical component, with respect to the crystal axes of the nonlinear optical component, fulfils the phasematching condition for a frequency conversion process. The wavelength mismatch error, α, is defined herein as the difference between the peak wavelength of the source light and the wavelength for which the nonlinear frequency conversion process in the nonlinear optical component has a maximum value (i.e. $\alpha = \Lambda_{peak,\ source} - \Lambda_{PM}$). The efficiency of the frequency conversion process generally becomes smaller as the absolute value of the wavelength mismatch error (i.e. |α|) increases. The maximum wavelength mismatch error for which the laser device is effective is defined herein as the acceptable wavelength mismatch error, ω. The laser device is effective when the absolute value of the wavelength mismatch error is less than or equal to the acceptable wavelength mismatch error (i.e. |α|≤ω); the laser device is not effective when the absolute value of the wavelength mismatch error is greater than the acceptable wavelength mismatch error (i.e. $|\alpha|>\omega$). As an example, the laser device is effective when the optical power of the output light 5 is above a minimum acceptable power. Aspects of the present invention provide a laser device with a small wavelength mismatch error and/or a large acceptable wavelength mismatch error, and therefore the laser device is unexpectedly and advantageously effective over a wide range of operating conditions.

Using source light which is laser light produces a frequency converted output light which has laser-like properties, including narrow spectral linewidth, high beam quality and strong linear polarisation. These properties are highly desirable for certain applications, such as in sensors which utilise absorption, fluorescence or scattering of the frequency converted light for a sensing function, because laser-like light can be better collimated than a non-laser-like light thereby achieving a longer path length and higher sensitivity. Laser-like light can also be focused to a smaller spot size than non-laser-like light which achieves higher power densities and enables smaller, lower cost detectors to be used in said sensors.

Additional optional optical components may act on the output light 5 after it has propagated out of the nonlinear optical component 4. For example, one or more output optical components, which may include a filter 6, may be used to reduce the amount of residual light 7 which overlaps with the output light 5. The residual light is source light 3 which passes through the nonlinear optical component but does not undergo the frequency conversion process. One or more output optical components 9 may be used to focus, collimate or redirect the residual light 7 or the output light 5. The elements of the device 1 may be enclosed within a housing 8.

Aspect: Laser Light Source and Nonlinear Component Configured for Small $\alpha$ In an aspect of the invention the laser light source 2 and nonlinear optical component 4 are configured to maintain a small wavelength mismatch error even when operating conditions for the device 1 are changed.

The wavelength mismatch error may be kept small by configuring the laser light source 2 and the nonlinear optical component 4 such that a change in the peak wavelength of the source light 3 with temperature, $\Delta\Lambda_{peak,source}/\Delta T|_{T_j}$, and a change with temperature of the wavelength for which the efficiency of the frequency conversion process is a maximum, $\Delta\Lambda_{PM}/\Delta T|_{T_j}$ have values which are approximately closely matched to one another (i.e. $\Delta\Lambda_{peak,source}/\Delta T|_{T_j} \approx \Delta\Lambda_{PM}/\Delta T|_{T_j}$). For example, a laser device may be operable over a range of temperatures equal to $2 \cdot T_{range}$ when the laser light source and nonlinear optical component are configured such that the following equation is satisfied:

$$\left|\Delta\Lambda_{peak,source}/\Delta T|_{T_j} - \Delta\Lambda_{PM}/\Delta T|_{T_j}\right| < \frac{\omega}{T_{range}},$$

where $T_j$ is an ambient temperature (for example the temperature of a surface of an apparatus that the device 1 is attached to). In a preferred example, $|\Delta\Lambda_{peak,source}/\Delta T|_{T_j} - \Delta\Lambda_{PM}/\Delta T|_{T_j}| < 0.05$ nmK$^{-1}$ and in a yet more preferred example, $|\Delta\Lambda_{peak,source}/\Delta T|_{T_j} - \Delta\Lambda_{PM}/\Delta T|_{T_j}| < 0.03$ nmK$^{-1}$ This aspect of the invention provides a device which is effective over a significantly wider range of operating conditions, compared to a device which does not fulfil this criterion, for the following changes in operating conditions:

1. Changes in ambient temperature.
2. Changes in the electrical current and/or voltage supplied to the laser light source 2.
3. Changes from continuous wave operation to pulsed operation or vice versa, or a change in pulse length and/or duty cycle during pulsed operation.

The range of operating conditions over which the device is effective is referred to herein as the operable range, and is measured with respect to a particular operating condition, such as ambient temperature. In this case the operable range may be defined as the range of ambient temperatures over which the power of the output light 5 remains above a fraction ($\beta$) of the maximum power of the output light within the range, where other parameters (for example the electrical current supplied to the laser light source 2) are unchanged. For example, $\beta$ may be greater than 0.1, preferably $\beta$ is greater than 0.5. The acceptable value of $\beta$ depends on the application for the device 1. Alternatively, the operable range with respect to ambient temperature may be defined as the range of ambient temperatures over which the power of the output light exceeds a particular value while other operating parameters remain within a target range. For example, the electrical current supplied to the laser light source remains below a maximum allowable value, such that the device may provide output light with power of at least a minimum power throughout the operating range of ambient temperatures without exceeding the maximum allowable electrical current.

As stated previously, the nonlinear optical component is configured such that $\Lambda_{PM} \approx \Lambda_{peak, source}$ for an initial design operating condition including, for example, an ambient temperature. $\Lambda_{peak, source}$ and $\Lambda_{PM}$ may be dependent on the temperature of the respective components. Therefore, $\Lambda_{PM} \approx \Lambda_{peak, source}$ may only be satisfied for the design operating condition. The temperatures of the laser light source 2 and nonlinear optical component 4 may move away from those of the design operating condition due to one or more of the following:

1. A change in ambient temperature in the vicinity of the components. An increase in ambient temperature will lead to an increase in component temperatures while a decrease in ambient temperature will lead to a decrease in component temperatures.
2. A change in electrical current and/or voltage supplied to the laser light source 2. The electrical power supplied to the laser light source will not be converted to light with 100% efficiency. The remaining power which is not converted to light is instead converted to heat. In addition to directly heating the laser light source itself, this heat may dissipate out from the laser light source. For example, the heat may be transferred to a mount containing the laser light source or to the air around the laser light source. Some of this heat may be transferred to the nonlinear optical component 4 via conduction between the mount of the laser light source and the nonlinear optical component, via convection in the air between the laser light source and the nonlinear optical component or via some other means. This results in an increase in temperature of the nonlinear optical component. If the electrical current and/or voltage supplied to the laser light source decreases then the amount of heat generated will decrease and the temperature of the components will decrease. Similarly, if the electrical current and/or voltage increases then the amount of heat generated will increase and the temperature of the components will increase. This changing condition includes switch-on of the device wherein the electrical current supplied to the laser light source increases from zero.

3. A change in operating mode of the laser light source from continuous wave to pulsed (or vice versa) or a change in pulse length and/or duty cycle of pulsed operation. Relative to a continuous wave injection current, when the device is operated in a pulsed condition for the same injection current the amount of heat generated by the laser light source decreases because the average electrical power supplied to the laser light source is reduced. Similarly for a change in pulse length or duty cycle, the amount of heat generated by the laser light source may change. A reduction in the amount of heat generated leads to lower component temperatures.

As the component temperatures moves away from those of the design operating condition, $\Lambda_{peak,\ source}$ and $\Lambda_{PM}$ may no longer be approximately equal to one another (i.e. the absolute value of the wavelength mismatch error ($|\alpha|$) becomes greater than zero). This results in a decrease in the efficiency of the frequency conversion process, with a larger absolute value of the wavelength mismatch error generally resulting in a greater decrease in the nonlinear conversion efficiency. This leads to a reduced power of the output light 5. The present inventors have found that this behaviour may severely limit the range of operating conditions for which the device 1 is effective, and thereby reduce the practical application of the device. In a first example, the power of the output light may vary significantly as one or more of the operating conditions 1, 2 and 3 above are changed, such that the device may only be practically used for a narrow range of said conditions. The limitation on the mode of operation of the device (operating condition 3 above) is presented here by the inventors for the first time and is a problem which has not previously been appreciated in the prior art.

Through configuring the laser light source and the nonlinear optical component such that $$|\Delta\Lambda_{peak,source}/\Delta T|_{T=T_{op}} - \Delta\Lambda_{PM}/\Delta T|_{T=T_{op}}| < 0.05\ \mathrm{nmK}^{-1}$$

where $T_{op}$ is an ambient temperature at which the device 1 is required to operate, the present inventors find that the device is effective over a wide range of operating conditions.

It is additionally advantageous for the laser light source 2 and nonlinear optical component 4 to be configured such that $$|\Delta\Lambda_{peak,source}/\Delta T|_{T_{min}\leq T\leq T_{max}} - \Delta\Lambda_{PM}/\Delta T|_{T_{min}\leq T\leq T_{max}}| < 0.05\ \mathrm{nmK}^{-1}$$

over the desired operable range of ambient temperature between a minimum temperature $T_{min}$ and a maximum temperature $T_{max}$.

Figure 2:
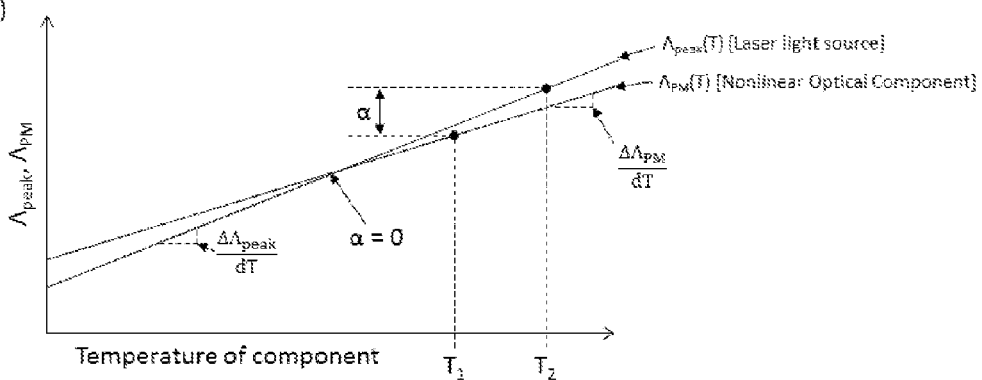
FIG. 2(a) and FIG. 2(b) show the relationship between $\Lambda_{peak}$, $\Lambda_{PM}$ and $\alpha$ as the temperature of the laser light source and the nonlinear optical component vary (a) according to an aspect of this invention and (b) not according to an aspect of this invention.
Figure 2:
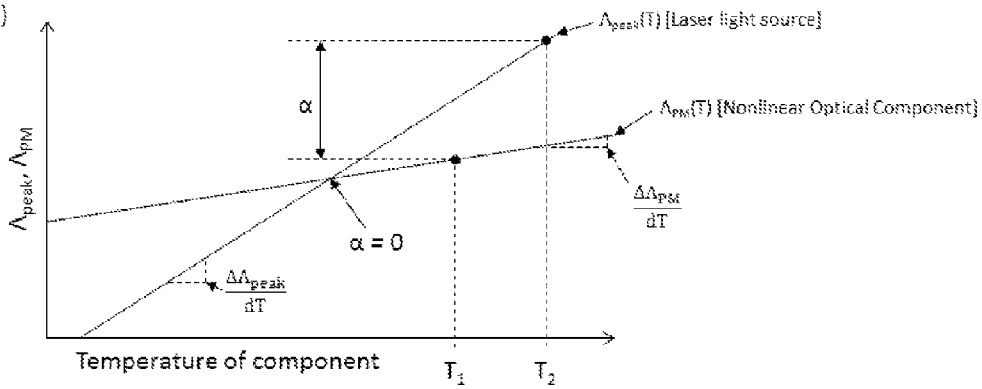

The schematic diagram in FIGS. 2(a)-2(b) illustrate the advantage of this aspect of the invention. The plot in FIG. 2(a) shows an exemplary dependence of $\Lambda_{peak,\ source}$ and $\Lambda_{PM}$ on temperature according to this aspect. In this case $\Delta\Lambda_{PM}/\Delta T$ and $\Delta\Lambda_{peak,source}/\Delta T$ each have a constant value throughout the temperature range. The device 1 is configured to have a wavelength mismatch error approximately equal to zero for an initial design condition, when the laser light source 2 and nonlinear optical component 4 are at the same temperature. Wavelength mismatch error ($\alpha$) remains small when the laser light source and the nonlinear optical component have similar temperature, throughout the temperature range shown in the plot. Furthermore, in an exemplary operating condition illustrated in FIG. 2(a) for which the laser light source has a temperature $T_2$ and the nonlinear optical component has a different temperature $T_1$ the wavelength mismatch error remains small, In comparison, the plot in FIG. 2(b) shows the dependence of $\Lambda_{peak,\ source}$ and $\Lambda_{PM}$ on temperature when the laser light source and nonlinear optical component are not configured according to this aspect of the invention. The wavelength mismatch error becomes large when the temperature of either component changes from the design condition.

A common solution found in conventional devices to achieve a large operable range is to use active temperature control which maintains either or both the laser light source 2 and nonlinear optical component 4 at a constant temperature or within a target temperature range, regardless of the ambient temperature. This requires adding one or more components to the laser light source and/or nonlinear optical component. The one or more components determine the temperature of the laser light source and nonlinear optical component and move heat into or out of the device based on a feedback loop to minimise the difference between the determined temperature and a target temperature of the laser light source and nonlinear optical component (for example the temperature of the design operating condition). While this approach is capable of producing a device with a wide operable range (for example with respect to ambient temperature, or with respect to duty cycle of pulsed operation), there are several drawbacks: (i) Active temperature control increases the complexity of the device by requiring additional components and control circuitry. This increase in complexity inevitably leads to an increase in manufacturing costs and increases the size of the device. (ii) Operating the one or more components used for active temperature control will also consume energy, resulting in increased running costs for the end user. (iii) If it is not acceptable to operate the active temperature control continuously (for example to minimise energy consumption), then there is a delay between when the active temperature control is activated and when the output light may be generated, while the component(s) in the device reach the required temperature or temperatures. The present invention overcomes these disadvantages by providing wide operating range with respect to ambient temperature.

Aspect: Stabilised Laser Light Source Wavelength for Small $\alpha$

Figure 3:
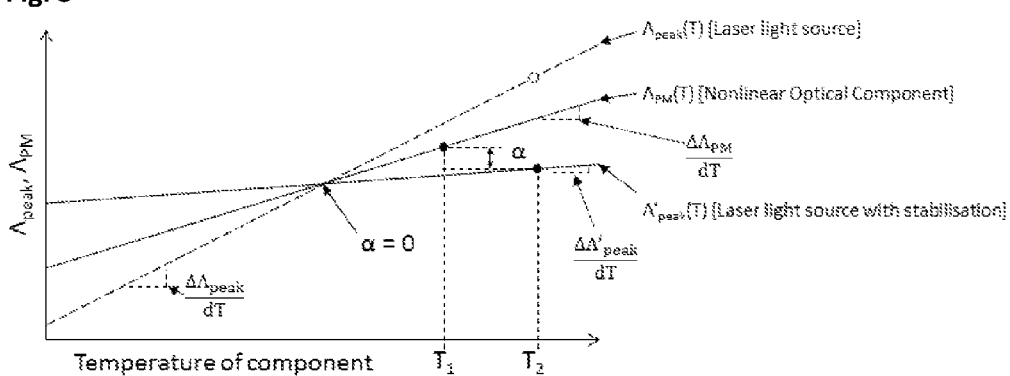
FIG. 3 shows the effect on $\alpha$ of configuring the laser light source such that the wavelength of source light is stabilised against changes in external operating conditions.

In another aspect of the invention, one or more optional optical components may be configured to stabilise the emission wavelength of the laser light source 2 with respect to variations in temperature, changes to the electrical current supplied to the laser light source and/or changes in the operating mode of the laser light source. This may further reduce the wavelength mismatch error caused by changes in operating conditions. The optical components reduce the magnitude of $\Delta\Lambda_{peak,source}/\Delta T$ to a new value $\Delta\Lambda'_{peak,source}/\Delta T$ such that $|\Delta\Lambda'_{peak,source}/\Delta T| < |\Delta\Lambda_{peak,source}/\Delta T|$, as illustrated in FIG. 3. This is particularly advantageous in cases where $\Delta\Lambda'_{peak,source}/\Delta T$ is closer in value to $\Delta\Lambda_{PM}/\Delta T$ than $\Delta\Lambda_{peak,source}/\Delta T$ is to $\Delta\Lambda_{PM}/\Delta T$. The wavelength mismatch error ($\alpha$) may then be reduced and the device is effective over a wider operable range (e.g. with respect to ambient temperature) than without the additional optical components. This is advantageous in situations when it is desirable to use a particular combination of laser light source and nonlinear optical component 4 but where either $\mathrm{sgn}(\Delta\Lambda_{peak,source}/\Delta T) \neq \mathrm{sgn}(\Delta\Lambda_{PM}/\Delta T)$ or $\Delta\Lambda_{peak,source}/\Delta T > 2 \cdot \Delta\Lambda_{PM}/\Delta T$. The nomenclature "sgn(x)" refers to the mathematical sign of the parameter x (i.e. positive or negative). For example, a device designed to generate a particular output wavelength $\lambda_{peak,\,output}$ may mean that a combination of laser light source and nonlinear optical component with $\Delta\lambda_{peak,source}/\Delta T \leq 2$. $\Delta\lambda_{PM}/\Delta T$ suffers from increased cost, increased complexity or simply does not exist.

Aspect: Housing with Thermal Contact for Small α.

Generally, an aspect of the invention is a laser device. In exemplary embodiments, the laser device includes a light source configured to emit a source light having a first peak wavelength, and a nonlinear optical component configured to perform a frequency conversion process that converts at least a portion of the source light into output light having a second peak wavelength different from the first peak wavelength. A stabilization component is configured to minimize a mismatch error constituting a difference between the first peak wavelength of the source light and a wavelength for which the frequency conversion process in the nonlinear optical component has a maximum value. The stabilization may include a housing that is thermally conductive between the light source and the nonlinear optical component to minimize a temperature difference between the light source and the nonlinear optical component.

Referring more particularly to FIG. 1, in another aspect of the invention, the laser light source 2 and nonlinear optical component 4 are both attached to a housing 8. The housing is configured to provide a large operable range for the device 1 with respect to changing operating conditions. For example, the housing is configured to provide an advantageously small wavelength mismatch error when there are changes in ambient temperature, changes to the electrical current supplied to the laser light source and/or changes in the operating mode of the laser light source. In one example, the housing is configured to have thermal conduction properties which provide a small wavelength mismatch error. In particular, the thermal conduction properties of the housing may be configured to exploit the condition according to an earlier aspect of the invention (specifically that $$|\Delta\lambda_{peak}/\Delta T|_{T=T_{op}} - \Delta\lambda_{PM}/\Delta T|_{T=T_{op}}| < 0.05 \text{ nmK}^{-1})$$

such that said thermal conduction properties provide an advantageously small difference between the temperature of the laser light source and the temperature of the nonlinear optical component for a wide range of operating conditions.

The housing is configured to provide a good thermal contact between the laser light source 2 and the nonlinear optical component 4, such that a change in temperature of the laser light source causes a change in the temperature of the nonlinear optical component. When the laser light source and the nonlinear optical component are in good thermal contact with each other, the difference between the temperature of the laser light source and the temperature of the nonlinear optical component during operation of the laser is smaller than said temperature difference if the laser light source and nonlinear optical component were thermally isolated from each other. The aforementioned temperature difference may be lower both during steady-state operation, and during non-steady-state operation. Furthermore, when the laser light source and the nonlinear optical component are in good thermal contact with each other, the difference between the temperature of the laser light source and the temperature of the nonlinear optical component is small even if there is a change in the ambient temperature, or a temperature gradient in the external environment.

The thermal properties of housing 8 may determine the relationship between the temperature of the laser light source 2 and the temperature of the nonlinear optical component 4. The thermal properties of the housing may be configured advantageously to:

1. Reduce the variation in power of the output light from the device for a constant electrical injection current while the device is not in a steady state thermal condition.
2. Reduce the variation in electrical injection current which is necessary to maintain a constant power of the output light while the device is not in a steady state thermal condition.
3. Decrease the time taken for the device to reach to a steady state thermal condition.

Conditions when the device is not in a steady state thermal condition include:

1. After the laser light source 2 has been switched on and before the device 1 reaches a steady thermal state at which the temperature of components does not change significantly with time. This may be considered as a "warm-up time".
2. When the ambient temperature is not constant with time.

For example, the thermal properties of the housing 8 may be configured to provide good thermal contact between the laser light source and the nonlinear optical component using one or more of the following:

1. The distance between the laser light source and nonlinear optical component is less than 100 mm, preferably less than 50 mm, and most preferably less than 30 mm.
2. The thermal conductivity of material in the housing which links the laser light source and the nonlinear optical component is at least 10 W·m$^{-1}$·K$^{-1}$, and preferably at least 100 W·m$^{-1}$·K$^{-1}$.
3. The heat capacity of the housing between the laser light source and the nonlinear optical component is less than 500 J·K$^{-1}$, preferably less than 200 J·K$^{-1}$, and most preferably less than 50 J·K$^{-1}$.

Furthermore, the heat capacity of the nonlinear optical component is less than 0.1 J·K$^{-1}$, advantageously facilitating rapid heating or cooling of said component in response to changes in the temperature of the housing 8.

Suitable values for the above parameters may depend on the configuration of the laser light source, the nonlinear optical component and the required operating range of the laser device, as will be explained in examples later in this disclosure.

When the thermal properties of the housing 8 are configured to provide good thermal contact between the laser light source and the nonlinear optical component, the difference in temperature between said components during operation of the device is preferably never more than 40° C., and more preferably never more than 10° C. These maximum temperature differences ensure sufficiently small wavelength mismatch errors for effective operation of the device.

Figure 4:
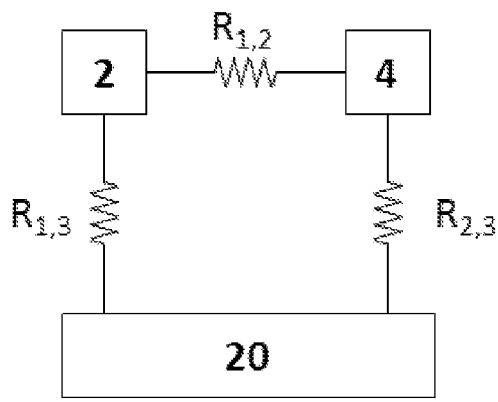
FIG. 4 shows a relationship between the laser light source, the nonlinear optical component and the heat sink with respect to the thermal resistances.

The good thermal contact between the laser light source 2 and the nonlinear optical component 4 may be described by the value of the absolute thermal resistance between said components. The absolute thermal resistance between two components is defined herein as the temperature difference between said components which is observed for a heat flow of 1 watt between said components (i.e. units of K·W$^{-1}$). As illustrated schematically in FIG. 4, the heat flow between the laser light source and the nonlinear optical component is primarily determined by the absolute thermal resistance between the laser light source and the nonlinear optical component, $R_{1,2}$, the absolute thermal resistance between the laser light source and a heat sink 20, $R_{1,3}$, and the absolute thermal resistance between the nonlinear optical component and the heat sink, $R_{2,3}$. The heat sink is a body with large thermal mass such that its temperature does not change significantly in response to the heat generated by the laser device. For example, the heat sink may be the air surrounding the laser device, or the air surrounding cooling fins which are attached to the laser device. The thermal resistance between the laser light source and other components (i.e. $R_{1,2}$ and $R_{1,3}$) is preferably defined from the external package of the laser light source. For example, if the laser light source is a laser diode mounted inside a metal can package, the thermal resistance is preferably defined from the metal can package.

The housing 8 may be advantageously configured to provide values of one or more of $R_{1,2}$, $R_{1,3}$ and $R_{2,3}$ such that:

i) $R_{1,2}$ is small. This facilitates transfer of heat between the laser light source and the nonlinear optical component so that a change in temperature of one component quickly leads to a change in temperature of the other component, thereby reducing a wavelength mismatch error. $R_{1,2}$ is preferably less than 100 K·W$^{-1}$, more preferably less than 10 K·W$^{-1}$, and most preferably less than 1 K·W$^{-1}$.

ii) $R_{1,2} < R_{1,3}$. This prevents preferential flow of heat from the laser light source directly to the heatsink, without heating of the nonlinear optical component, thereby reducing a wavelength mismatch error.

iii) $R_{1,2} + R_{2,3} < R_{1,3}$. This facilitates flow of heat from the laser light source to the heatsink along a thermal path via the nonlinear optical component, providing rapid transfer of heat from the laser light source to the nonlinear optical component and thereby reducing a wavelength mismatch error.

iv) $R_{1,3}$, $R_{2,3}$ and $R_{3,3}$ are all small. $R_{3,3}$ is defined as the thermal resistance within the heatsink. This facilitates flow of heat from the laser light source to nonlinear optical component and thereby reduces a wavelength mismatch error. $R_{1,3}$, $R_{2,3}$ and $R_{3,3}$ are preferably all less than 10 K·W$^{-1}$.

Three comparative examples demonstrate the advantages of this aspect of the invention. The plots in FIGS. 5(a), 6(a) and 7(a) show schematically the temperature of the laser light source 2, the temperature of the nonlinear optical component 4 and the wavelength mismatch error ($\alpha$) in the time period after the laser light source is switched on.

Figure 5A:
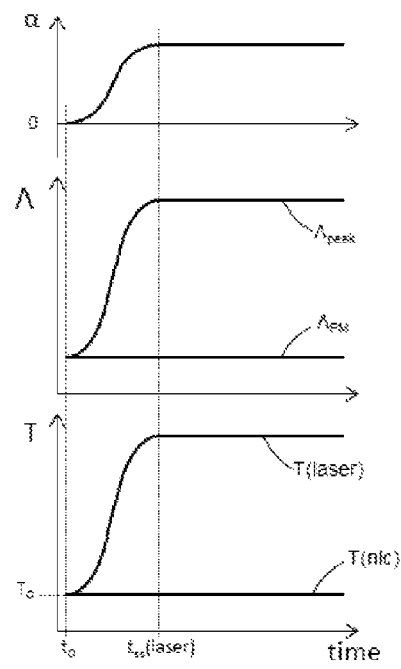
FIG. 5(a) and FIG. 5(b) show the temperature of the laser light source and the nonlinear optical component, emission wavelength of the laser light source and phase matching wavelength of the nonlinear optical component, and wavelength mismatch error for a first comparative example when (a) the wavelength mismatch error is zero at switch on and (b) the wavelength mismatch error is zero at steady state.

For the first comparative example (FIG. 5(a)), the laser light source 2 and the nonlinear optical component 4 are not attached to a housing 8, and there is negligible thermal contact between the two components ($R_{1,2}$ is very large; for example at least 1000 K·W$^{-1}$). Initially the laser light source and the nonlinear optical component are both at a similar temperature, for example the ambient temperature. The laser light source temperature increases when the laser light source is switched on and its temperature tends towards a steady state value which is reached at time $t_{ss}$(laser). By this time the rate of thermal energy generated in the laser light source equals the rate of thermal energy dissipation to the heat sink 20. Meanwhile, the temperature of the nonlinear optical component is unchanged from its initial value. As a consequence, the wavelength mismatch error changes significantly during the period between the time the laser light source is switched on and the time that the device reaches a steady thermal state. This example applies if the components are mounted onto an optical bench in a laboratory-based laser. For example, if $R_{1,2}$=1000 K·W$^{-1}$, $R_{2,3}$=$R_{1,3}$=10 K·W$^{-1}$, the heat sink temperature is 25° C., in steady state the laser light source temperature is approximately 65° C., the nonlinear optical component temperature is approximately 25° C., resulting in a large difference in temperature of 40° C. and causing a large wavelength mismatch error.

Figure 6A:
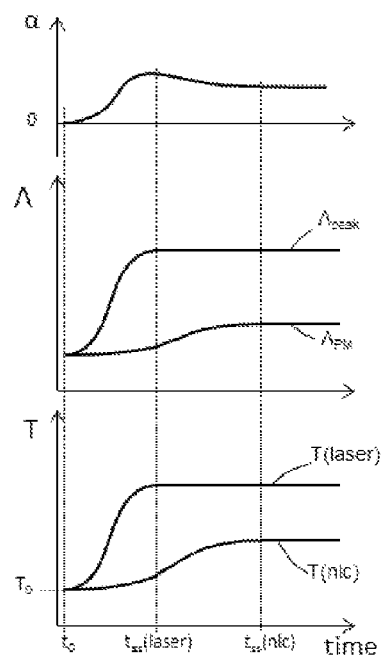
FIG. 6(a) and FIG. 6(b) show the temperature of the laser light source and the nonlinear optical component, emission wavelength of the laser light source and phase matching wavelength of the nonlinear optical component, and wavelength mismatch error for a second comparative example when (a) the wavelength mismatch error is zero at switch on and (b) the wavelength mismatch error is zero at steady state.

For the second comparative example (FIG. 6(a)), the laser light source 2 and the nonlinear optical component 4 are both attached to a housing 8 and have good thermal contact, for example where the thermal resistance of the housing between the two components ($R_{1,2}$) is approximately 10 K·W$^{-1}$. The laser light source temperature increases when the laser light source is switched on and its temperature tends towards a steady state value which is reached at time $t_{ss}$(laser). A flow of heat from the laser light source to the nonlinear optical component causes the temperature of the nonlinear optical component to rise. Owing to the smaller thermal resistance ($R_{1,2}$) relative to the first example, the temperature of the nonlinear optical component increases more quickly and, reaches steady state at time $t_{ss}$(nlc), lower than the steady state temperature of the laser light source. The wavelength mismatch error changes less during the period than for the first comparative example. For example, if $R_{1,2}$=10 K·W$^{-1}$, $R_{2,3}$=$R_{1,3}$=10 K·W$^{-1}$, the heat sink temperature is 25° C., in steady state the laser light source temperature is approximately 52° C., the nonlinear optical component temperature is approximately 38° C., resulting in a small difference in temperature of 14° C. and consequently an advantageously small wavelength mismatch error.

Figure 7A:
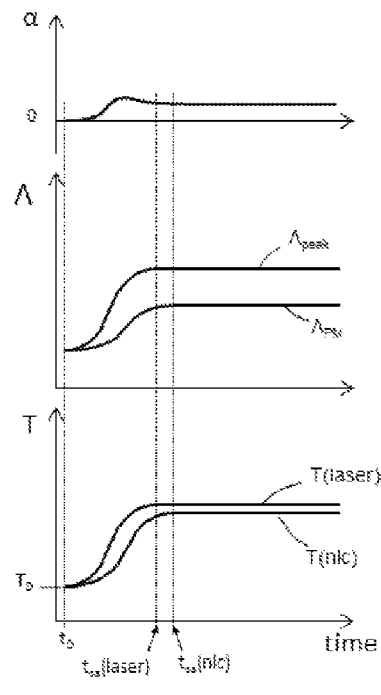
FIG. 7(a) and FIG. 7(b) show the temperature of the laser light source and the nonlinear optical component, emission wavelength of the laser light source and phase matching wavelength of the nonlinear optical component, and wavelength mismatch error for a third comparative example when (a) the wavelength mismatch error is zero at switch on and (b) the wavelength mismatch error is zero at steady state.

For the third comparative example (FIG. 7(a)), the laser light source 2 and the nonlinear optical component 4 are both attached to a housing 8 and have very good thermal contact, for example where the thermal resistance of the housing between the two components ($R_{1,2}$) is less than 1 K·W$^{-1}$. The laser light source temperature increases when the laser light source is switched on and its temperature tends towards a steady state value which is reached at time $t_{ss}$(laser). A flow of heat from the laser light source to the nonlinear optical component causes the temperature of the nonlinear optical component to rise. Owing to the small thermal resistance ($R_{1,2}$) relative to the first and second examples, the temperature of the nonlinear optical component rises very quickly and reaches a steady state (at time $t_{ss}$(nlc)) which is similar to the steady state temperature of the laser light source. The wavelength mismatch error changes significantly less during the period than for the first comparative example. For example, if $R_{1,2}$=1 K·W$^{-1}$, $R_{2,3}$=$R_{1,3}$=10 K·W$^{-1}$, the heat sink temperature is 25° C., in steady state the laser light source temperature is approximately 46° C., the nonlinear optical component temperature is approximately 44° C., resulting in a very small difference in temperature of 2° C. and consequently an advantageously small wavelength mismatch error.

Figure 5B:
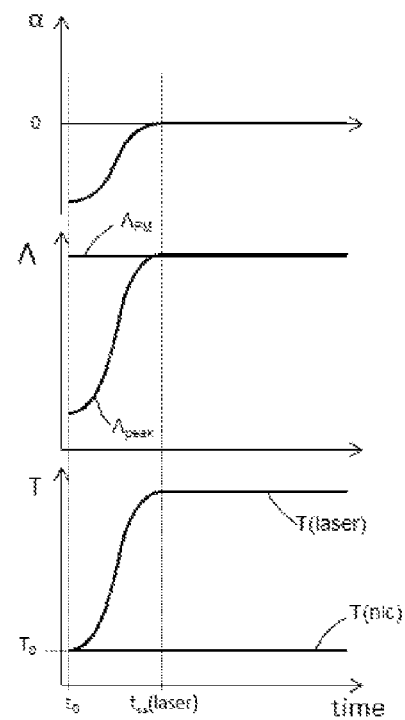
Figure 6B:
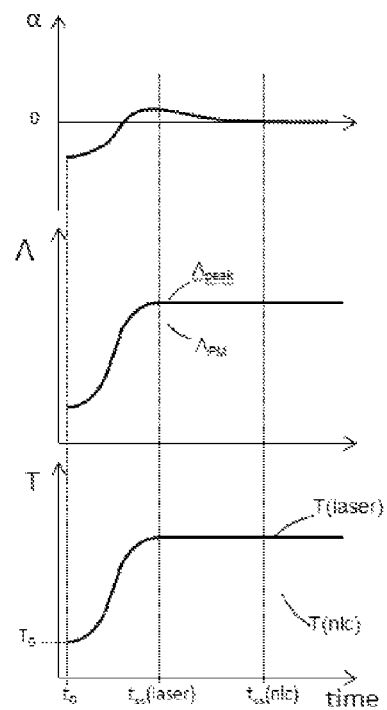
Figure 7B:
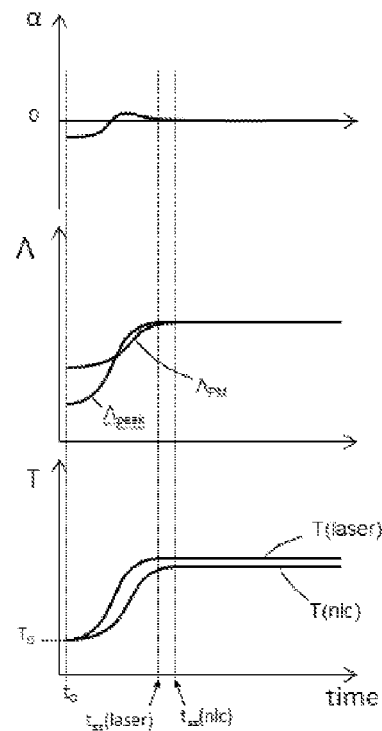

In the above first through third comparative examples, the laser light source and nonlinear optical component were configured such that $\Lambda_{PM}$ and $\Lambda_{peak}$ were approximately equal when the laser light source was switched off (e.g. both components at ambient temperature). Alternatively, the laser light source and the nonlinear optical component may be configured such that $\Lambda_{PM}$ at $t_{ss}$(nlc) is equal to $\Lambda_{peak}$ at $t_{ss}$(laser). This reduces the wavelength mismatch error during steady state operation but results in the wavelength mismatch error being non-zero when the laser light source is switched on, as shown in FIGS. 5(b), 6(b) and 7(b). This may lead to a period after switch on of the device where the wavelength mismatch error is unacceptably large, thus requiring that the device be allowed to "warm up" before it may be used. It can be seen for the second and third comparative examples that configuring the nonlinear optical component in this way advantageously reduces the maximum value of $|\alpha|$ compared to a device where the nonlinear optical component is configured such that α=0 when the laser light source is switched on.

The addition of a housing 8 with optimised thermal properties brings the advantage of a device which has the desirable properties of a reduced variation in output power when the device is not in a steady state condition and a reduced time taken to reach a steady state condition from a non-steady state condition.

Aspect: Residual Laser Light Heats the Nonlinear Optical Component for Small α

In another aspect of the invention, the laser device is configured so that some or all the source light 3 which passes through the nonlinear optical component 4 but does not undergo the frequency conversion process (also referred to as the residual light 7) is utilised to heat the nonlinear optical component. This may provide an advantageously small wavelength mismatch error when there are changes to the electrical current supplied to the laser light source 2 and/or changes in the operating mode of the laser light source. Fourth and fifth comparative examples demonstrate the advantage of this aspect of the invention (made with reference to the first, second and third comparative examples described previously).

Figure 8A:
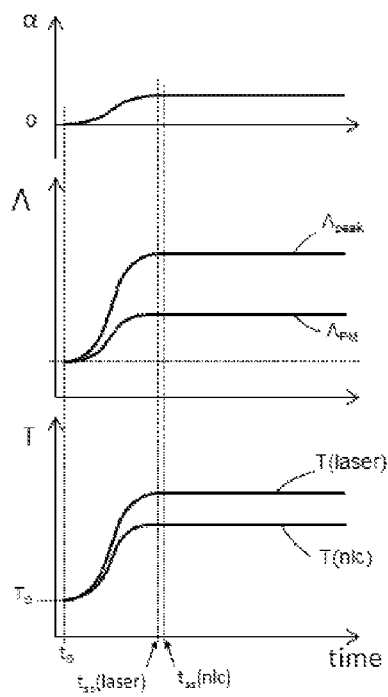
FIG. 8(a) and FIG. 8(b) show the temperature of the laser light source and the nonlinear optical component, emission wavelength of the laser light source and phase matching wavelength of the nonlinear optical component, and wavelength mismatch error for a fourth comparative example when (a) the wavelength mismatch error is zero at switch on and (b) the wavelength mismatch error is zero at steady state.
Figure 8B:
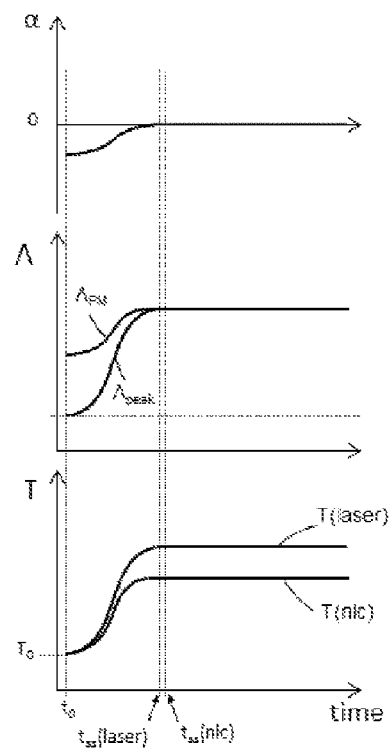

For the fourth comparative example (FIG. 8(*a*)), the laser light source 2 and the nonlinear optical component 4 are both attached to a housing 8, optionally the thermal resistance of the housing between the two components ($R_{1,2}$) is small, and the housing is configured so that the residual light 7 is utilised as an additional source of heat for the nonlinear optical component. The some or all of the residual light is directed—for example using one or more mirrors—such that it is incident on an absorbing component which is in thermal contact with the nonlinear optical component. Some or all of the residual light which is incident on the absorbing component is absorbed at the absorbing component such that the absorbed light causes the temperature of the absorbing component to increase and, in turn, this causes the temperature of the nonlinear optical component to increase. The laser light source temperature increases when the laser light source is switched on and its temperature tends towards a steady state value which is reached at time $t_{ss}$(laser). Heating of the absorbing component, which is caused by absorption of residual light at the absorbing component, and optionally also a flow of heat from the laser light source to the nonlinear optical component, cause the temperature of the nonlinear optical component to rise. Owing to this heating effect, the temperature of the nonlinear optical component rises quickly and reaches a steady state (at time $t_{ss}$(nlc)) which is similar to the steady state temperature of the laser light source. The wavelength mismatch error changes significantly less during the period than for the first comparative example.

The power of the residual light 7 which is incident on the absorbing component may be configured to provide advantageously favourable change in temperature of the nonlinear optical component when the laser light source is switched on. For example, the fraction of the residual light which is directed onto the absorbing component may be configured to provide an advantageously favourable change in temperature of the nonlinear optical component. The thermal resistance between the nonlinear optical component and the heat sink and/or the laser light source may be configured to provide a preferred steady-state temperature of the nonlinear optical component.

Figure 9A:
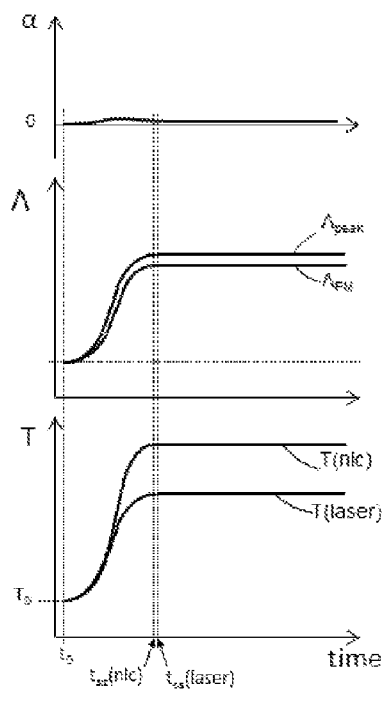
FIG. 9(a) and FIG. 9(b) show the temperature of the laser light source and the nonlinear optical component, emission wavelength of the laser light source and phase matching wavelength of the nonlinear optical component, and wavelength mismatch error for a fifth comparative example when (a) the wavelength mismatch error is zero at switch on and (b) the wavelength mismatch error is zero at steady state.
Figure 9B:
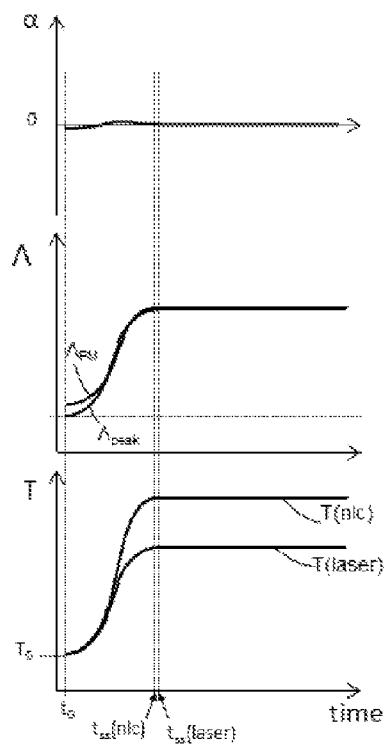

For the fifth comparative example, (FIG. 9(*a*)), the power of the residual light 7 incident on the absorbing component is configured so that the steady-state temperature of the nonlinear optical component 4, when the laser light source 2 is switched on, is higher than the temperature of the laser light source. The laser light source temperature increases when the laser light source is switched on and its temperature tends towards a steady state value which is reached at time $t_{ss}$(laser). Heating of the absorbing component is caused by absorption of residual light at the absorbing component. Owing to this heating effect, the temperature of the nonlinear optical component rises quickly and reaches a steady state (at time $t_{ss}$(nlc)) which is higher than the steady state temperature of the laser light source. The wavelength mismatch error changes significantly less during the period than for the first comparative example. It may be advantageous for the steady-state temperature of the nonlinear optical component to be higher than the steady-state temperature of the laser light source if $\Delta\Lambda_{peak,source}/\Delta T|_{T=T_j} > \Delta\Lambda_{PM}/\Delta T|_{T=T_j}$.

In the same manner as for the first through third comparative examples, the nonlinear optical component may be configured such that $\Lambda_{PM}$ at $t_{ss}$ (nlc) is equal to $\Lambda_{peak, source}$ at $t_{ss}$(laser). The effect of this on the fourth and fifth comparative examples is shown in FIGS. 8(*b*) and 9(*b*).

For this aspect of the invention, where the residual light 7 is utilised as an additional source of heat for the nonlinear optical component 4, it is especially advantageous if the heat capacity of the nonlinear optical component is less than 0.1 $J \cdot K^{-1}$, advantageously facilitating rapid heating or cooling of said component in response to changes in the temperature of the housing 8.

Aspect: Focusing of Laser Light for Large ω

In another aspect of this invention the laser device 1 is configured so that the acceptable wavelength mismatch error, ω, is large and therefore the laser device has a large operable range with respect to changing operating conditions. According to this aspect of the invention, the laser device is configured so that the source light 3 incident on the nonlinear optical component 4 has a convergence angle which provides a large acceptable wavelength mismatch error. The focusing condition will be described throughout this disclosure as the far-field convergence half-angle in air of the laser light which is incident on the nonlinear optical component. For brevity this may also be referred to as the convergence half-angle.

Figure 10:
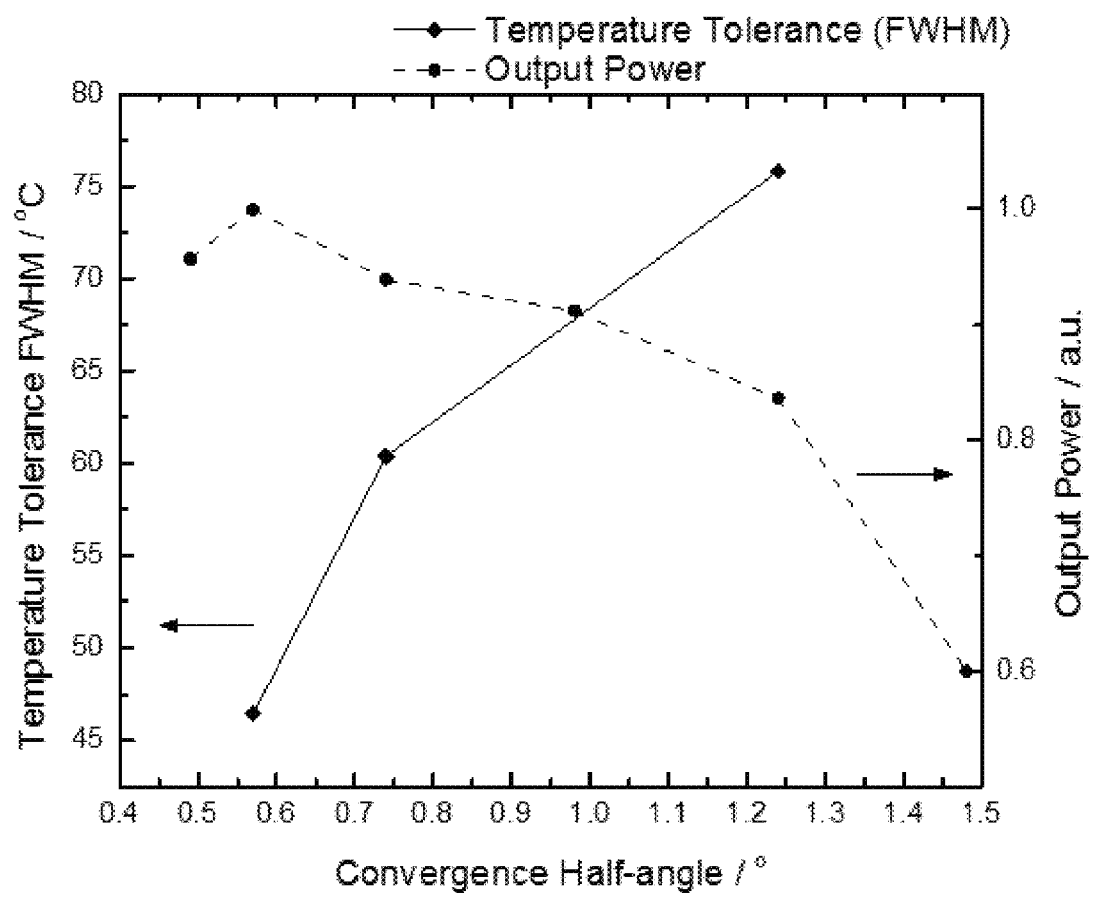
FIG. 10 shows experimental data on the dependence of temperature tolerance and power of the output light of a laser device according to this invention on the convergence half-angle of the source light incident on the nonlinear optical component.

The present inventors have determined that there is an advantageous increase in the acceptable wavelength mismatch error when the device 1 is configured such that a convergence half-angle of the source light 3 is different from a value which provides the maximum frequency conversion efficiency or maximum output power (i.e. the convergence half-angle which would conventionally be used to provide a frequency converted laser device to provide maximum output power). In particular, there is an advantageous increase in the acceptable wavelength mismatch error when a convergence half-angle is significantly larger than the value which provides the maximum frequency conversion efficiency. For nonlinear optical frequency conversion in which phase matching is provided through birefringent phase matching, there is a direction in the nonlinear optical component for which rotation about said direction provides the largest change in phase matched wavelength of input light with respect to a change in angle of rotation about said direction. This direction is referred to herein as the phase matching rotation axis. It is particularly advantageous for increasing the acceptable wavelength mismatch error of the device if the convergence half-angle of the source light measured in the plane which is perpendicular to the phase matching rotation axis of the nonlinear optical component is larger than the value which provides the maximum frequency conversion efficiency. Data in FIG. 10 illustrates the advantages. This data, which is explained in more detail in Example 1, demonstrates a significant advantageous increase in operable range of a laser when a convergence half-angle is increased away from the value which provides maximum frequency conversion efficiency.

The optimum convergence half-angle for the laser light incident on the nonlinear optical component to provide a device which maximises the power of frequency-converted (e.g. SHG) output light may be calculated according to the prior art. For example, the method of Freegarde et al. [Journal of the Optical Society of America B 14, 2010 (1997)], or as disclosed in US patent application number 2015/0177593A1, may be used. If a larger convergence half-angle is used according to this aspect of the invention, for example by reducing the focal length of the lens used to focus the laser beam into the nonlinear optical component, the beam contains a larger spread of directions through the nonlinear optical component. This may act to broaden the range of wavelengths which are able to undergo phase matched frequency conversion, as illustrated schematically in FIGS. 11(a) and 11(b) with FIG. 11(a) corresponding to a broader range of wavelengths as compared to FIG. 11(b). The effect of this is to reduce the maximum achievable frequency conversion efficiency, but to increase the acceptable wavelength mismatch error of the device, thereby reducing the effect of changes in operating conditions and providing a laser device with a larger operable range.

The present inventors have determined that without this aspect of the invention, which provides a large acceptable wavelength mismatch error, a device may exhibit poor operable range with respect to changes in operating conditions including changes in ambient temperature and changes between pulsed operation and continuous wave operation. A solid-state laser light source (e.g. a semiconductor laser diode) may exhibit a significant shift in peak emission wavelength, $\Lambda_{peak,\ source}$, when changing from operating in continuous wave mode to operating in pulsed mode or vice-versa. This results in a device 1, which is optimised to operate in continuous wave mode, having unexpectedly poor output power if it is operated in pulsed mode, or vice versa, because of the increase wavelength mismatch error which is introduced when the operation mode is changed. During continuous operation more heat is generated leading to the solid-state laser light source reaching a higher temperature when compared with pulsed operation. In addition, during pulsed operation there is a period when the laser light source is off. During this period heat is dissipated away from the laser light source, allowing its temperature to return to ambient temperature before the next laser pulse. This aspect of the invention, which increases the acceptable wavelength mismatch error, may be additionally advantageous when a device is desired which is capable of being operated in both continuous wave and pulsed operation modes because a larger acceptable wavelength mismatch error gives an improvement in output power stability when the mode of operation of the device is changed. Note that in this case the improved stability is obtained between the continuous wave power and the pulsed power obtained while the laser is on, rather than the average power over the whole pulse period. The need for a single device rather than two separate devices is of benefit to the manufacturer (simplified manufacturing; reducing costs) and to the end user, especially for applications which require both continuous wave and pulsed devices (one device required rather than two; reduced expenditure).

Furthermore, by increasing the acceptable wavelength mismatch error, the tolerance on the orientation of the nonlinear optical component 4 during assembly is relaxed. This has the advantageous effect of simplifying the manufacturing process of the device, thereby reducing the cost of the device.

Aspect: Broad Range of Wavelengths in Source Light for Large ω

In another aspect of the invention, the laser device 1 includes a laser light source 2 which is configured to emit laser light with a broad spectral linewidth. This provides a laser device with a large acceptable wavelength mismatch error, ω, and therefore the laser device has a large operable range with respect to changing operating conditions.

Whereas for previous aspects only the peak wavelength, $\Lambda_{peak,\ source}$, has been discussed, the intensity at each wavelength of the spectrum of the source light 3, I($\Lambda$), must now be considered. The spectral linewidth of the source light is defined herein as the difference between an upper wavelength and a lower wavelength, where the lower wavelength is defined such that the fraction of the power of the source light with wavelength less than the lower wavelength is 5% of the total power of the source light, and the upper wavelength is defined such that the fraction of the power of the source light with wavelength greater than the upper wavelength is 5% of the total power of the source light.

According to the prior art, it is preferable to use laser light with a narrow spectral linewidth (e.g. less than 0.1 nm) because this provides the highest frequency conversion efficiency, owing to the nonlinear dependence of frequency-conversion efficiency on the power of the laser light incident on the nonlinear optical component. For example, in the case of SHG, the power of frequency-doubled output light with wavelength $\lambda_1$ is approximately proportional to the second order of the power of the input light with wavelength $\Lambda_1=2\lambda_1$. Therefore, to obtain a high power of the output light, it is advantageous for the power of the input light to be distributed over a very small range of wavelengths, rather than the same power to be distributed over a broad range of wavelengths.

However, the present inventors have determined that, in combination with other aspects of the invention, an advantageous increase in operable range for the laser device may be obtained if the laser light source 2 is configured to have a broad spectral linewidth, such as for example, a spectral linewidth of at least 0.5 nm, and preferably at least 1 nm.

The output power of a device 1 using a laser light source configured to emit a narrow spectral linewidth may be strongly affected by a small change in the operating conditions which cause either $\Lambda_{peak,\ source}$ or $\Lambda_{PM}$ to change. However, the output power of a device 1 using a laser light source configured to emit a broad spectral linewidth is found to have much larger operable range with respect to changing operating conditions which cause a change to $\Lambda_{peak,\ source}$ or $\Lambda_{PM}$. A first set of devices 1 were manufactured, each including a laser light source 2 emitting source light 3 with peak wavelength $\Lambda_{peak,\ source}\approx 442$ nm and a nonlinear optical component 4 including a β-BaB$_2$O$_4$ crystal configured to provide Type 1 SHG of the source light. Three different devices within the first set of devices had lenses configured to act on the source light 3 so that the source light 3 incident on the nonlinear optical component had three different convergence half angles (measured in the plane perpendicular to the phase matching axis of the β-BaB$_2$O$_4$ crystal), as indicated by the horizontal axis in FIG. 12. In the three devices in the first set, the laser light source 2 was configured so that the spectral linewidth of the source light was ≈0.14 nm, referred to herein as "narrow linewidth". A second set of three devices was manufactured, the same as the first set except that the laser light source was configured so that the spectral linewidth of the source light was ≈1.9 nm, referred to herein as "broad linewidth". FIG. 12 compares the experimentally measured operable range with respect to temperature of the nonlinear optical component 4 for devices in the first and second sets. The devices in the second set ("broad linewidth") have larger operable ranges than devices in the first set ("narrow linewidth") with equivalent convergence half-angles of the source light. Here the operable range has been defined as the temperature range of the nonlinear optical component over which the device delivers power of the output light more than 50% of the power of the output light at the design condition (i.e. β>0.5), also known as the full width at half maximum (FWHM). By configuring the laser light source to have a broad spectral linewidth a device may advantageously be produced which has a smaller decrease in power of the output light as operating conditions change away from the design conditions.

Furthermore, by combination of the convergence half-angle larger than optimum to obtain highest efficiency frequency conversion for a single wavelength (the previous aspect of the invention), with a broad spectral linewidth of the laser light, an advantageous increase in operable range may be obtained with smaller reduction in efficiency of frequency conversion than expected for application of either of the two aspects individually.

Aspect: Stabilised Direction for Output Light

In another aspect of the invention one or more beam stabilising optical components is optionally included in the device 1, where a beam stabilising optical component acts on the output light 5 exiting the nonlinear optical component 4 such that at least one of the direction and position of the output light varies less with a change in operating condition than without said beam stabilising optical components.

The present inventors have determined that during operation of a device 1 according to the other aspects of the invention, a change in operating conditions may cause a change in the propagation direction of the output light 5 exiting the nonlinear optical component 4. This change in the propagation direction of the output light becomes significant when the device 1 has a large operable range, as enabled by other aspects of this invention.

Figure 13:
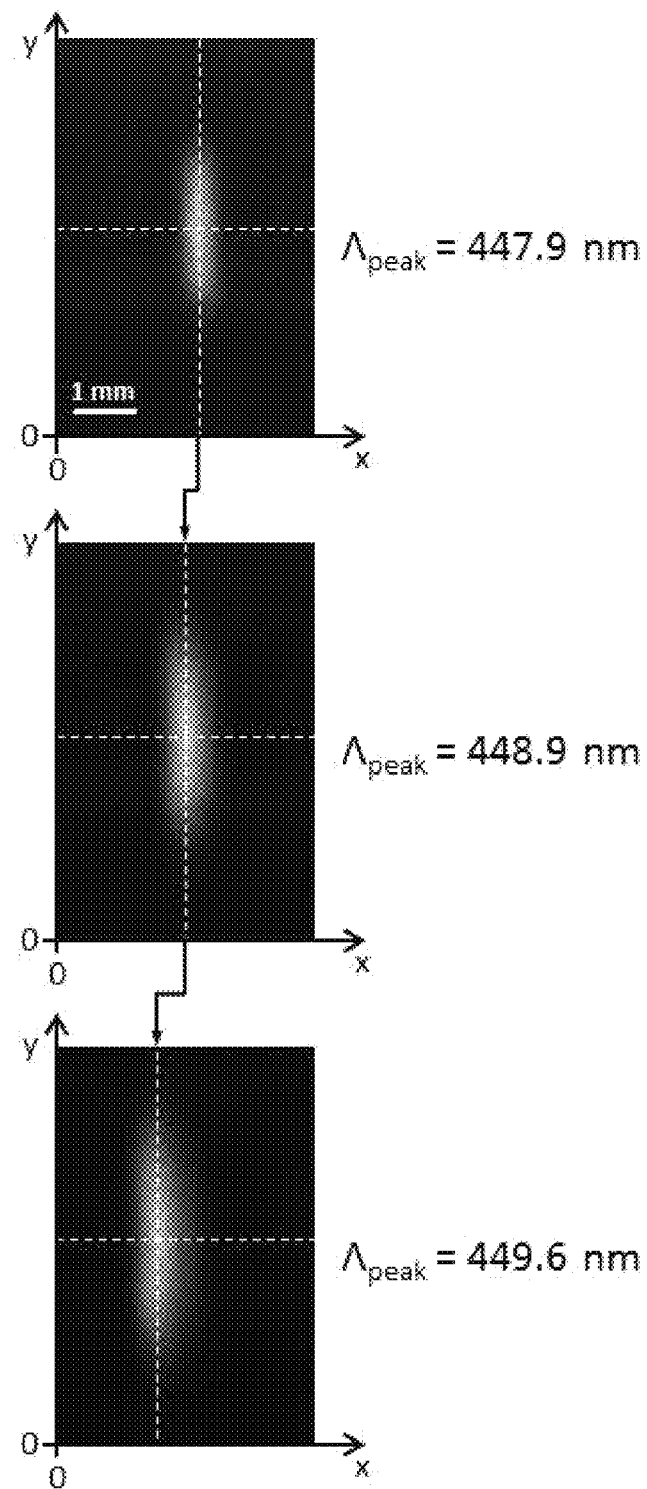
FIG. 13 shows experimental measurements of the position of the beam of output light for source light with different wavelengths.

A device 1 was manufactured including a laser light source 2 emitting source light 3 with peak wavelength $\Lambda_{peak,\,source}$≈449 nm and a nonlinear optical component 4 including a β-BaB$_2$O$_4$ crystal configured to provide Type 1 SHG of the source light. Lenses were configured so that source light 3 was converging in both planes of the beam as it was incident on the nonlinear optical component, and the source light formed a waist within the β-BaB$_2$O$_4$ crystal. The output light 5 propagated out from the nonlinear optical component, the output light 5 was filtered to remove residual light 7, and the output light 5 was then incident on a CCD beam profiler. The CCD beam profiler recorded the intensity distribution of the output light 5. The distance between the nonlinear optical component and the CCD beam profiler was ≈8 cm. FIG. 13 displays experimental data showing the intensity distribution of the output light 5 when the laser light source 2 was configured to emit source light with peak wavelength of 447.9 nm, 448.9 nm and 449.6 nm (no other changes were made to the device; for example the orientation and position of the nonlinear optical component were not changed). The centre of the output light beam in the horizontal and vertical directions is indicated by dotted white lines. The displacement of the centre of the output light beam at the CCD corresponds to a change in the direction of the output light propagating out from the nonlinear optical component when $\Lambda_{peak,\,source}$ was changed and with constant $\Lambda_{PM}$. This dependence of propagation direction on operating conditions is due to a change in the wavelength mismatch error (caused by a change in operating conditions) causing the nonlinear optical process to take place along different directions in the nonlinear optical component. For example, if the wavelength of the source light emitted by the laser light source changes, due to a change in operating conditions, the direction of the output light may change.

This has the previously unappreciated effect of causing the direction of the output light to undesirably depend on the operating conditions of the device. This effect is observed now owing to the advantageous increases in operable range of the laser device provided by other aspects of the invention. A change in the direction of the output light with operating conditions is disadvantageous for many applications.

One or more beam stabilising components can reduce or eliminate the change in direction of the output light 5, such change in direction generally being shown in FIG. 14(a). Example beam stabilising components are illustrated in FIGS. 14(b)-14(e) and may be refractive, diffractive, dispersive or reflective. Beam stabilising components may include any combination of a lens 90 located a distance from the centre of the nonlinear optical component 4, measured along the propagation direction of the output light, approximately equal to the effective focal length of said lens, a reflective or transmissive diffraction grating 91, a prism 92, and a mirror such as an off-axis parabolic mirror 93. The light beam which propagates out from the nonlinear optical component propagates in a direction which varies depending on the operating condition of the device 1. For example, as shown in FIG. 14(a) at a first operating condition the light may propagate along a first direction 80, at a second operating condition the light may propagate along a second direction 81 while at a third operating condition the light may propagate along a third direction 82. As is shown in FIGS. 14(b)-(e), the difference between the directions of propagation for lights at two different operating conditions is reduced after the lights have interacted with the beam stabilising components. FIG. 14(a) shows the variation in the direction of output light without a beam stabilising component. FIG. 14(b) shows the variation in the direction of the output light when a convex lens 90 is used as the beam stabilising component. FIG. 14(c) shows the variation in the direction of output light when a reflective diffraction grating 91 is used as a beam stabilising component. FIG. 14(d) shows the variation in the direction of output light when a prism 92 is used as a beam stabilising component. FIG. 14(e) shows the variation in the direction of output light when an off-axis parabolic curved mirror 93 is used as beam stabilising component. For the examples in FIG. 14(b) and FIG. 14(e) the shape of the optical component (lens or mirror) provides a different deflection in the direction of the light depending on the direction of the light incident on the optical component to reduce the variation in the final direction of the output light. For the examples in FIG. 14(c) and FIG. 14(d), the dependence of the direction of the output light on the wavelength of the output light is combined with an optical component (grating or prism) which provides a different deflection in the direction of the light depending on the wavelength of light to reduce the variation in the final direction of the output light.

By including a beam stabilising component in the device the undesirable dependence of the output beam on operating conditions is advantageously removed.

The aspects of the invention may be advantageously combined together. In particular, aspects which provide a small wavelength mismatch error, and aspects which provide a large acceptable wavelength mismatch error are advantageously combined to provide a laser device with a broad operable range with respect to operating conditions.

Example 1: Deep Ultraviolet Laser with $\lambda_{peak,\ output}$=225 nm

Figures 15, 16:
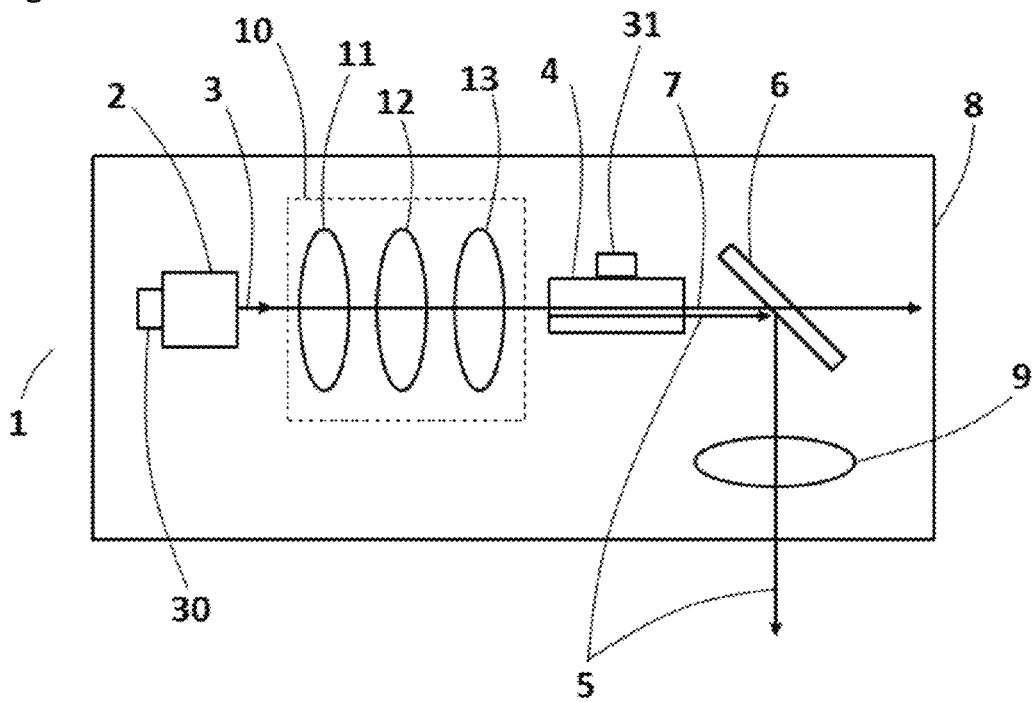
FIG. 15 shows an exemplary laser device according to an aspect of this invention.
FIG. 16 is a table showing suitable values for θ for Type 1 phase matching in a β-BaB$_2$O$_4$ crystal for source light with different input wavelengths Λ.

A first example of the invention is a device 1 which emits laser-like light with a wavelength in the deep ultraviolet spectral range (wavelength between ≈200 nm and ≈300 nm) with a large operable range with respect to ambient temperature and operating mode. A schematic diagram of an exemplary embodiment of the laser device 1 is shown in FIG. 15. The laser device includes a laser light source 2 which emits source laser light 3 and a nonlinear optical component 4.

The laser light source 2 may be a semiconductor laser which emits light with a peak wavelength between a lower value of approximately 400 nm and an upper value of approximately 600 nm. The laser light source is preferably a Fabry-Perot laser diode including $Al_yIn_xGa_{1-x-y}N$ semiconductor materials and $Al_yIn_xGa_{1-x-y}N$ light-emitting layers (0≤x≤1; 0≤y≤1), and this is the case for the remainder of this example. The laser light source emits source light 3 with a peak wavelength of $\lambda_{peak,\ source}$≈450 nm for an injection current equal to an operating current, $J_O$, when the temperature of the package of the laser light source is 25° C. (e.g. a temperature of the package of a laser diode may be a temperature of the metal can which the laser diode is packaged inside, such as a standard 5.6 mm can package). The laser light source may be configured to emit a near-diffraction limited beam (as characterised by a beam quality in all planes of the beam of $M^2$<2), but in this example the laser light source is configured to emit a non-diffraction limited beam with $M^2$ approximately equal to values between 4 and 8. The laser light source in this example is configured to have a dependence of peak wavelength on the temperature of the package between −0.02 nm·K$^{-1}$ and +0.08 nm·K$^{-1}$ for a package temperature between −10° C. and 70° C. Preferably the dependence is between +0.01 nm·K$^{-1}$ and +0.06 nm·K$^{-1}$ for a package temperature between −10° C. and 70° C. For the remainder of this example, the value is approximately equal to +0.04 nm·K$^{-1}$ for a package temperature between −10° C. and 70° C.

A nonlinear optical component 4 is configured to provide frequency-conversion of the source light 3 emitted by the laser light source 2. The nonlinear optical component is preferably a β-BaB$_2$O$_4$ crystal configured to provide birefringent phase matched type I second harmonic generation (SHG) of the light emitted by the laser light source. Preferably the β-BaB$_2$O$_4$ crystal is arranged such that the surface of the crystal which the laser light propagates through as it enters the crystal (the entrance surface) and the surface of the crystal which the output light propagates through as it exits the crystal (the exit surface) are both approximately perpendicular to the laser light beam and that the laser light beam propagates inside the crystal at an angle (θ) approximately 63° away from the optic axis of the crystal with the dominant electric field of the laser light perpendicular to the optic axis. This configuration favourably provides high efficiency SHG (i.e. a high ratio of power of frequency converted output light divided by power of laser light) at a wavelength of $\lambda_{PM}$≈450 nm for a crystal temperature of approximately 25° C. For laser light with other wavelengths, suitable values of θ are listed in FIG. 16. The β-BaB$_2$O$_4$ crystal has a length, as measured parallel to the direction of propagation of light inside the crystal, preferably between 1 mm and 20 mm and more preferably between 5 mm and 15 mm. For the remainder of this example the length of the β-BaB$_2$O$_4$ crystal is approximately 7 mm. The β-BaB$_2$O$_4$ crystal has a width and height, measured in two orthogonal directions perpendicular to the length and where width and height are not necessarily equal, preferably between 0.2 mm and 5 mm, more preferably between approximately 0.5 mm and 2 mm, and most preferably approximately 1 mm. Smaller values of width and height provide a nonlinear optical component with advantageously small heat capacity.

Figure 17:
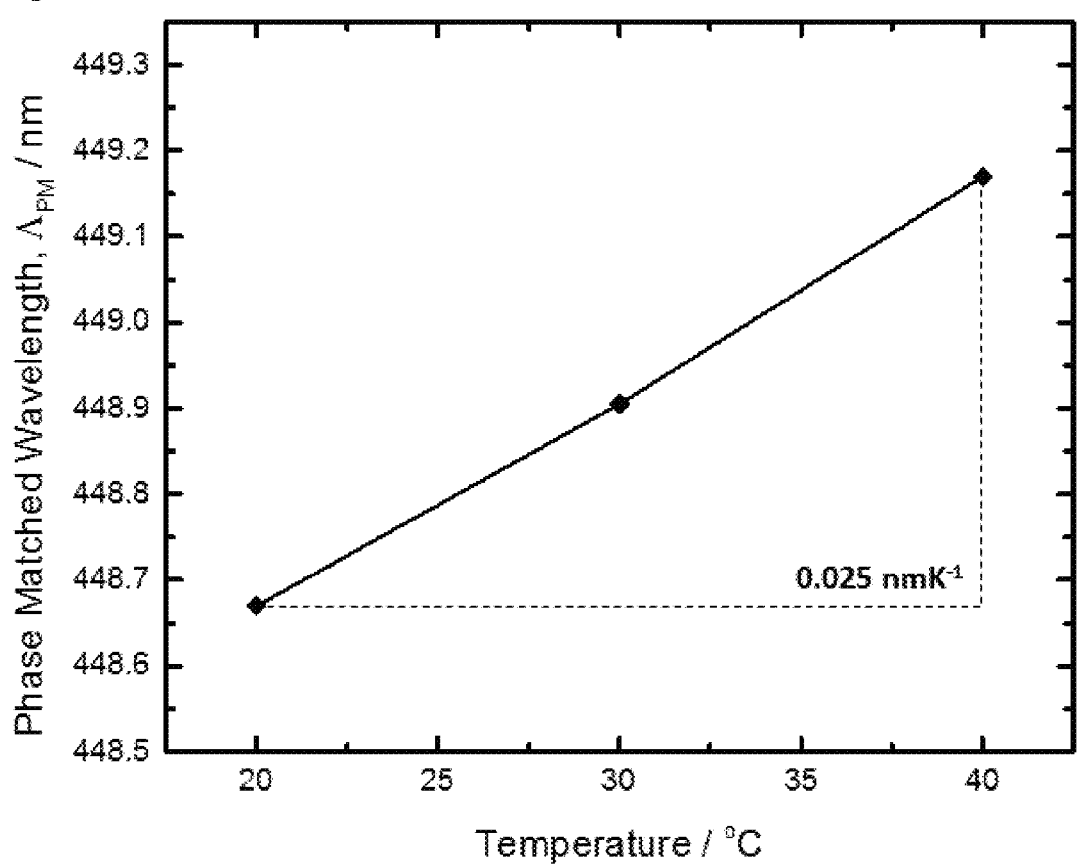
FIG. 17 shows the optimum phase matched wavelength as a function of crystal temperature for a β-BaB$_2$O$_4$ crystal, as measured experimentally.

Through new experiments the present inventors have determined, and show here for the first time that for SHG using β-BaB$_2$O$_4$ with input laser light wavelengths of $\lambda_{peak,\ source}$≈449 nm (θ=64°), the dependence of $\lambda_{PM}$ on temperature for a β-BaB$_2$O$_4$ crystal as described and with a length of 7 mm is approximately equal to 0.025 nm·K$^{-1}$. Relevant data is shown in FIG. 17, where $\lambda_M$ for a 7 mm long β-BaB$_2$O$_4$ crystal was measured at 20° C., 30° C. and 40° C. using a laser with tuneable emission wavelength and determining the laser wavelength which produced the highest second harmonic power, all while the direction of the source beam within the β-BaB$_2$O$_4$ crystal was unchanged. Therefore, through use of laser light sources configured to have dependence of peak wavelength on the temperature of the package as described, an advantageously small wavelength mismatch error may be provided over a wide range of operating conditions, such as ambient temperature.

Referring again to FIG. 15, the source light 3 emitted by the laser light source 2 is coupled into the nonlinear optical component 4 using one or more optional optical components 10. Preferably the one or more optional optical components are configured to provide a frequency-conversion process with good efficiency and wide operable range with respect to changes in operating conditions. The optical components may affect one or more of the following properties of the laser light incident on the nonlinear optical component:

1. The direction of propagation of the beam.
2. The spatial position of the beam.
3. The spatial position of a waist of a focused (converging) beam.
4. A convergence half-angle of a focused (converging) beam.

For example, a collimating lens 11, a first cylindrical lens 12 and a second cylindrical lens 13 may be disposed in the optical path between the laser light source and the nonlinear optical component. The source light 3 emitted by the laser light source is incident on a collimating lens which collects the light into a partially or wholly collimated beam in at least one place of the beam. An example of a suitable lens is a moulded or precision polished glass aspheric lens with a focal length between 2 mm and 5 mm. In this example the collimating lens is a moulded glass aspheric lens with a focal length of 3 mm. The collimated laser beam is incident on a first cylindrical lens which focuses the light in a first plane of the beam, and then on a second cylindrical lens which focuses the light in a second plane of the beam (where the second plane of the beam is approximately perpendicular to the first plane of the beam) where the first and second cylindrical lenses are configured so that the beam converges in both the first and second planes of the beam as it propagates towards the nonlinear optical component 4.

Preferably the beam converges to a waist in at least one plane of the beam (i.e. a minimum beam width in a plane of the beam) within the nonlinear optical component. In an alternative option, a single lens (e.g. a spherical lens) may be used instead of first and second cylindrical lenses.

For this example, the convergence half-angle of the source light 3 in the plane perpendicular to the phase matching axis is in the range 0.4°-2.7° which may be provided using a first cylindrical lens 12 with focal length between 30 mm and 200 mm, and is preferably approximately 1.2°. For this example the convergence half-angle of the laser light in the plane parallel to the phase matching axis is in the range 1°-12° which may be provided using a second cylindrical lens 13 with focal length between 5 mm and 75 mm, and is preferably approximately 6°. The dominant electric field of the laser light is approximately parallel to the phase matching axis of the nonlinear optical component.

As the laser light propagates through the nonlinear optical component, output light with wavelength $\lambda_{peak,\ output} = \lambda_{peak,\ source}/2 \approx 225$ nm is generated by SHG from the laser light. Unconverted, also referred to herein as residual, laser light 7 (i.e. any laser light which is not converted by SHG) and the output light 5 both propagate out of the nonlinear optical component. The residual laser light and the output light may be spatially overlapping. A filter 6 which reduces the power of the residual laser light more than it reduces the power of the output light may be used. Most preferably, after a filter the power of the output light which exits the filter is greater than the power of the residual light which exits the filter and is substantially coincident with the output light which exits the filter. It is the power of the output light with a peak wavelength of $\lambda_{peak,\ output}$ which is considered when referring to the power of the output light of the laser device; the power of any residual laser light with peak wavelength $\lambda_{peak,\ source}$ present in the output beam is not included. The filter may include one or more mirrors including a distributed Bragg reflector (DBR) which has a reflectivity greater than 90%, more preferably a reflectivity greater than 99%, to the second harmonic light and a reflectivity less than 1% to the residual laser light. Suitable DBR mirrors may be fabricated using layers of $MgF_2$ and $LaF_3$ on a UV fused silica substrate. The filter may also include a dispersive element, such as a UV fused silica prism (e.g. a Pellin-Broca prism or an equilateral prism) arranged to spatially separate the output light and the residual laser light. The output light 5 may be collected into a substantially collimated beam using one or more optional additional optics 9. A suitable optic is a UV fused silica spherical lens. Any of the one or more additional optics may have an antireflection coating which reduces the reflection of light with wavelength $\lambda_{peak,\ output}$.

The laser light source 2, the nonlinear optical component 4, and optionally one or more of any optional optical components 6, 9, 10 are attached to a housing 8 which preferably provides good thermal contact between the laser light source and one or more nonlinear optical components, and further provides a compact laser device. A wide range of materials are suitable for the housing, including metals and non-metals. The housing is configured to provide a rigid platform for housing the laser light source, the nonlinear optical component and any other optical components, through selection of suitable material or materials and its shape. Metal materials are particularly suitable owing to their mechanical stiffness, thermal conductivity and ease of fabrication in suitable shape, for example by machining or casting. Examples of suitable metallic materials include aluminium, copper, zinc, steel and alloys based on the aforementioned materials. The housing provides a first fixture point 30 to which the laser light source is attached. The housing further provides a second fixture point 31 to which the nonlinear optical component is attached. Preferably the thermal resistances between the laser light source and the first fixture point, between the nonlinear optical component and the second fixture point, and between the first fixture point and the second fixture points are all small. The distance between the first and second fixture points is less than 200 mm, and preferably less than 100 mm. Preferably the thermal properties of the housing are configured such that the difference in temperature between the laser light source (a temperature of the external package of the laser diode, or a temperature of a sub-mount which the laser diode semiconductor chip is attached to) and the $\beta$-$BaB_2O_4$ crystal is never more 40° C. during operation of the device (for example, from switch-on through to steady thermal state). More preferably said temperature difference is never more than 10° C.

For this example the housing is a continuous aluminium component with thermal resistance between the first fixture point and the second fixture point approximately equal to 5 $K \cdot W^{-1}$. The footprint of the housing is preferably less than 200 mm×50 mm and more preferably less than 50 mm×50 mm, where "footprint" refers to a rectangle which the surface of the housing fits wholly inside.

Preferably the one or more optical components 10 disposed on the optical path between the laser light source 2 and the nonlinear optical component 4 are configured to provide a laser device 1 with an advantageously large operable range and a good frequency-conversion efficiency. According to information in the prior art, the operable range of a laser device with the structure of the current example, with respect to changes in ambient temperature, is expected to be very small. The tolerances of the laser device may be estimated using the commonly used "SNLO" public domain software developed at Sandia National Laboratories for modelling of the efficiency of frequency-conversion processes in nonlinear optical materials. For a 7 mm long $\beta$-$BaB_2O_4$ crystal configured to convert 450 nm laser light to 225 nm output light by SHG at 25° C., the expected output power at different temperatures may be calculated using the 2D-mix-LP function of SNLO in the following way: The crystal orientation for phase matching at the design temperature is calculated (e.g. using SNLO's Qmix tool). The refractive indices of the crystal are then computed over a range of temperatures using equations found in e.g. Kato et al. [Proc. SPIE 7582 1L (2010)] and the phase velocity mismatch ($\Delta k$) between the fundamental wavelength and the second harmonic wavelength calculated. The refractive indices and phase velocity mismatch are then used as inputs to the 2D-mix-LP model. This allows the temperatures at which the output power falls to e.g. 50% of the power at 25° C. (i.e. $\beta$=0.5) to be found. For the laser light source and nonlinear optical component described in this example, the expected tolerance to change in temperature is $\approx$22° C.

For the device structure of the present example, however, experimental measurements of the effect of the convergence half-angle of the source laser light in the plane perpendicular to the phase-matching axis of a $\beta$-$BaB_2O_4$ crystal on the frequency-conversion efficiency and on the operable range are shown in FIG. 10, and show substantial unexpected advantage. Firstly, FIG. 10 shows the dependence of the power of the output light on the convergence half-angle. It is apparent that the power of the output light is highest for smaller convergence half-angles, and is near a maximum for a convergence half-angle of approximately 0.6°; which is consistent with expectation from the prior art (e.g. US patent application number 2015/0177593A1). Secondly, however, FIG. 10 shows the experimentally-measured change to the β-BaB$_2$O$_4$ temperature for which the efficiency of frequency conversion drops to 50% of its maximum value (the full width at half maximum, FWHM). It can be seen that for a laser device according to this example, when the output power is maximised (convergence half-angle≈0.6°), the measured tolerance to change in β-BaB$_2$O$_4$ temperature is ≈46° C., more than double that predicted by the SNLO software. Thus, a laser device according to this invention has the unexpected and advantageous characteristic of reduced variation in output light intensity for changes in temperature of the laser light source (and consequently the wavelength of the laser light) and for changes in temperature of the β-BaB$_2$O$_4$ crystal.

Furthermore, there is a significant improvement in the tolerance to a change in β-BaB$_2$O$_4$ or laser light source temperature when the convergence half-angle measure in the plane perpendicular to the phase matching axis is increased away from the convergence half-angle which provides the highest SHG conversion efficiency. Therefore, a device according to this example with the convergence half-angle measured in the plane perpendicular to the phase matching axis which is larger than the convergence half-angle which provides optimum frequency conversion efficiency provides the unexpected advantage of a larger acceptable wavelength mismatch, and therefore a broader operable range for the laser with respect to changes in temperature, changes to the injection current supplied to the laser or changes in the operating mode of the laser.

For a convergence half-angle approximately equal to 1.2°, the experimentally measured temperature tolerance (FWHM) of the β-BaB$_2$O$_4$ crystal is 75.8° C. (FIG. 10), corresponding to a half-width at half maximum tolerance of 0.5×75.80° C.=37.9° C., which corresponds to an acceptable wavelength mismatch error (ω) of 37.9×0.025 nm=0.95 nm (using the value of 0.025 nm·K$^{-1}$ determined above; FIG. 17). For a target operable range of T$_{range}$=30° C. (e.g. 0° C. to 60° C., as required for many applications of laser sources), ω/T$_{range}$≈0.03 nm·K$^{-1}$, as used in the first aspect of the detailed description. With the laser light source 2 configured to have a dependence of peak wavelength on temperature of approximately +0.04 nm·K$^{-1}$, the nonlinear optical component having a dependence of Λ$_{PM}$ on temperature of approximately +0.025 nm·K$^{-1}$, |∂Λ$_{peak}$/∂T|$_{T=T_j}$−∂Λ$_{PM}$/∂T|$_{T=T_j}$|=(0.04−0.025) nm·K$^{-1}$=0.015 nm·K$^{-1}$<0.03 nm·K$^{-1}$, thereby satisfying the first aspect.

While this example has been described for a single nonlinear optical component, it should be appreciated that more than one nonlinear optical component can be used. For example, a pair of crystals arranged to provide walk-off compensation may be used. While this example has been described for the material β-BaB$_2$O$_4$, it should be appreciated that other materials can be used. For example the material may be SiO$_2$, Al$_y$Ga$_{1-y}$N (0.5≤y≤1), CsLiB$_6$O$_{10}$, LiB$_3$O$_5$, KBe$_2$BO$_3$F$_2$, Li$_2$B$_4$O$_7$, LiRbB$_4$O$_7$, MgBaF$_4$, Ba$_{1-a}$B$_{2-b-c}$O$_4$—Si$_a$Al$_b$Ga$_c$ (0≤a≤0.15; 0≤b≤0.10; 0≤c≤0.04; a+b+c≠0).

Figure 18:
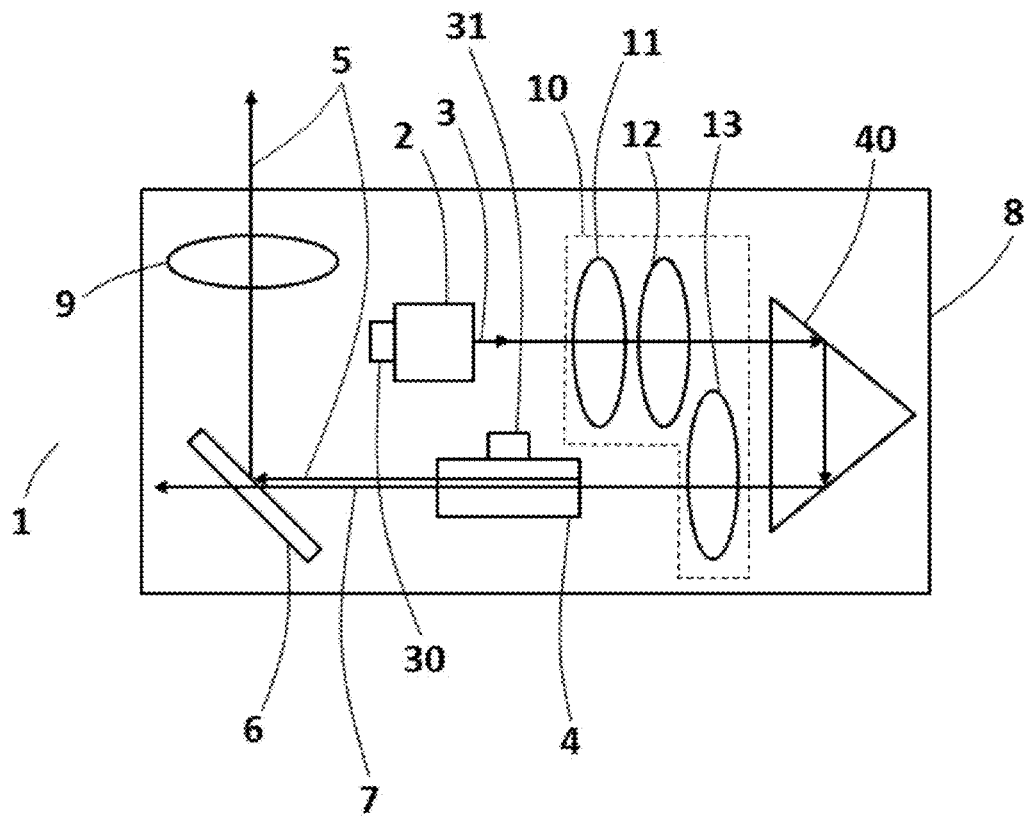
FIG. 18 shows an exemplary laser device according to an aspect of this invention which includes a beam folding optical component.

Example 2: Deep Ultraviolet Laser with $\lambda_{peak,\ output}$≈223 nm with a Beam Folding Optical Component A second example of this invention is now disclosed. The second example is similar to the first example and common features may not be repeated. In this second example, which is illustrated in FIG. 18, a beam folding optical component 40 is disposed on the optical beam path between the laser light source 2 and the nonlinear optical component 4. For example, the beam folding optical component may be a triangular prism with internal angles of 45°, 45° and 90°. The prism may be arranged such that the source laser light 3 enters the prism approximately perpendicular to the face opposite the 90° angle, undergoes total internal reflection at a second face of the prism, undergoes total internal reflection at a third face of the prism, and exits the prism with a direction of propagation parallel, but in opposite direction, to the direction of the laser light incident on the prism (as shown in FIG. 18). Alternatively, the beam folding optic may be one or more mirrors which reflect the source light.

The beam folding optical component 40 advantageously simultaneously enables good thermal contact between the laser light source 2 and the nonlinear optical component 4 and use of optical components 10 configured to provide a convergence half-angle of source light 3 incident on the nonlinear optical component which provides a large operable range of the laser device and good frequency-conversion efficiency. In particular, the beam folding optical component enables the laser light source and the nonlinear optical component to be placed in closer proximity to each other, thereby reducing the thermal resistance between the two components. As presented previously, this may improve the operable range with respect to changes in ambient temperature, changes in the electrical current supplied to the laser light source, and changes in the operating mode of the laser light source, and may reduce the time the laser device takes to arrive at a steady state thermal condition from a non-steady state condition.

The laser light source 2 may be a Fabry-Perot laser diode similar to that in the first example, emitting source light 3 with a peak wavelength of Λ$_{peak}$≈445.9 nm at a package temperature of 25° C. (the temperature of the metal can containing the laser diode) for an injection current J$_0$, with a wavelength dependence on package temperature of approximately +0.04 nm·K$^{-1}$ and a spectral linewidth of approximately 1.7 nm. The collimating lens 11 may be a moulded aspheric lens. A first cylindrical lens 12 and a second cylindrical lens 13 are configured to focus the source light so that the source light converges in at least one plane of the beam as it propagates towards the nonlinear optical component 4. The first cylindrical lens focuses the source light in the plane containing the propagation direction of the beam and the direction perpendicular to the electrical field vector of the laser light. The source light incident on the nonlinear optical component has a convergence half-angle of approximately 1.2° in this plane. The second cylindrical lens focuses the source light in the plane perpendicular to the first cylindrical lens. The source light incident on the nonlinear optical component has a convergence half-angle of approximately 6° in this plane. A triangular prism 40 as described earlier in this second example is used to "fold" the source light beam and is arranged such that the source light passes through the beam folding prism after passing through the first cylindrical lens 12 and before passing through the second cylindrical lens 13. The collimating lens, cylindrical lenses and the surface of the beam folding prism opposite the 90° angle all have antireflection coatings for the wavelength of the source light. The nonlinear optical component is a single β-BaB$_2$O$_4$ crystal with a length of 7 mm configured for type I SHG, similar to that in the first example but where the source light propagates inside the nonlinear optical component at an angle θ=64.5° away from the optic axis of the crystal. This configuration provides effective SHG for the source light. The dominant electric field of the source light is parallel to the phase matching axis of the β-BaB$_2$O$_4$ crystal, and perpendicular to the optic axis of the β-BaB$_2$O$_4$ crystal. The nonlinear optical component is configured so that the power of the second harmonic light is a maximum when the laser device was operated at 25° C. The power of the output light with $\lambda_{peak,\ output} \approx 223$ nm emitted by the device at a package temperature of 25° C. is 29.8 µW for a laser diode injection current of 700 mA. A filter 6 is used to reduce the power of the residual laser light 7 which spatially overlaps with the output light 5 exiting the nonlinear optical component, as described in the first example. An optical component 9, which may include a lens, is positioned after the filter to collimate the output light 5.

The laser light source 2, collimating lens 11, first cylindrical lens 12, beam folding optical component 40, second cylindrical lens 13, nonlinear optical component 4, filter 6 and lens 9 are all attached to a housing 8. In this example the housing is fabricated from a single piece of aluminium alloy, but other materials may be used, as in the first example. The housing which contains the components described in this example has a footprint of 66.5 mm×50 mm and has a total height including the optical components) of 12.5 mm. The housing is fitted with a lid which brings the total package size to 66.5 mm×50 mm×15 mm. The distance between the laser light source and the β-BaB$_2$O$_4$ crystal is approximately 27 mm, a decrease of approximately 36 mm compared to a laser device which does not include a beam folding optical component.

The laser device 1 described in this example is demonstrated herein to have exceptionally broad operable range with respect to changes in ambient temperature. The laser device was operated with constant electrical injection current supplied to the laser light source for ambient temperatures between 3.3° C. and 55° C. The dependence of the power of the output light on the ambient temperature is plotted in FIG. 19. The data shows that the power of the output light 5 remains higher than 55% of the power of the output light for the original design condition (25° C.) throughout the range. This demonstrates the combined effect of (A) the advantageously small wavelength mismatch error in the laser device, owing to (i) the laser light source 2 and nonlinear optical component 4 being configured to provide a dependence of $\Lambda_{peak}$ on temperature approximately equal to the dependence of the $\Lambda_{PM}$ on temperature, and (ii) the housing 8 configured to provide good thermal contact between the laser light source and nonlinear optical component; and (B) the advantageously large acceptable wavelength mismatch error in the laser device, owing to (i) the collimating lens 11 and first cylindrical lens 12 and second cylindrical lens 13 being configured to provide a convergence half-angle for the source light 3 significantly larger than for optimum frequency-conversion efficiency, and (ii) the laser light source being configured to emit source laser light with a broad spectral bandwidth.

The laser device 1 is significantly different from, and advantageous over, laser devices in the prior art which may be configured to provide deep UV light (wavelength less than 260 nm). In particular, the combination of laser light source 2 and nonlinear optical component 4 in a compact housing 8 (footprint=33 cm$^2$), the provision of good thermal contact between the laser light source and the nonlinear optical component, the absence of temperature stabilising components acting on at least one of the laser light source and the nonlinear optical component, and extremely large operable range of the laser device with respect to ambient temperature are all individually novel over any examples in the prior art. In particular, the laser device produces approximately twice as much deep ultraviolet output power as the system described in the recent prior art of Ruhnke et al. [Optics Letters 40, p 2127 (2015)] (≈30 µW compared to ≈16 µW), while operating at a lower laser diode injection current (700 mA compared to 800 mA) and without the need to place the β-BaB$_2$O$_4$ crystal in an oven to actively control the temperature. Compact laser devices emitting deep UV light with large operable range according to this invention enable new technology for sensing and disinfection.

Figure 19:
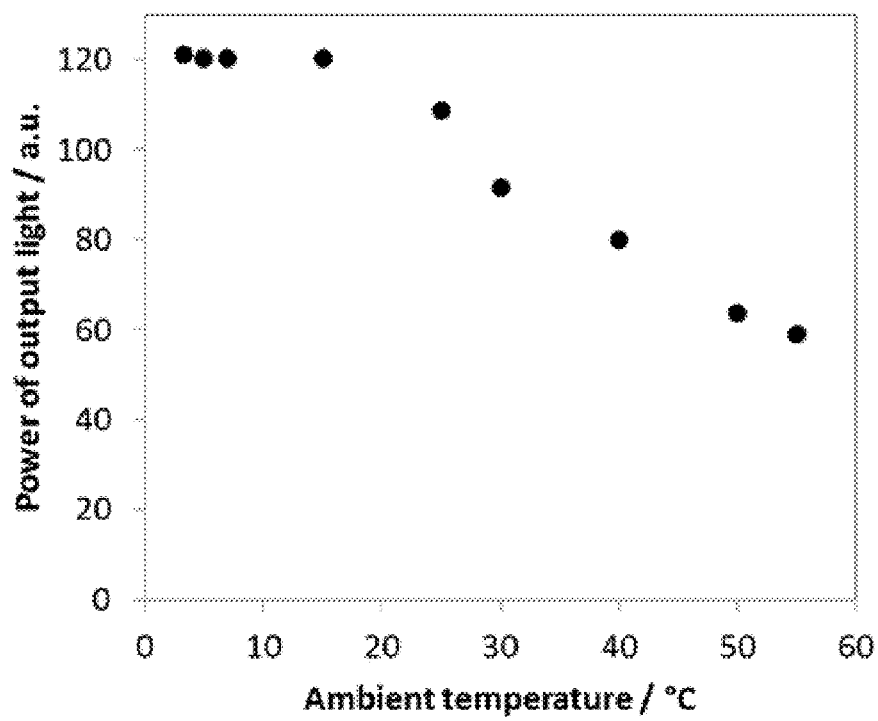
FIG. 19 shows the power of the output light from a device constructed according to the second example of this invention as a function of ambient temperature, as measured experimentally.

The data in FIG. 19 shows that the power of the output light 5 unexpectedly increases for temperatures lower than the design condition temperature even though the wavelength mismatch error increases as the temperature is reduced below the design condition temperature. For further advantageous improvements in the operable range of the laser device, therefore, it is preferred that the nonlinear optical component 4 is configured to provide optimised frequency-conversion efficiency for the wavelength of source light 3 emitted by the laser light source 2 when the ambient temperature is higher than midway through the required operable temperature range of the laser device 1. For example, it is preferable in a laser device with operable range between 0° C. and 25° C. for the nonlinear optical component to be configured to provide optimum frequency conversion efficiency at 25° C., rather than the midway temperature of 12.5° C. as would be naturally expected.

Example 3: Housing which Makes Use of Residual Blue Light to Heat BBO Crystal

Figure 20:
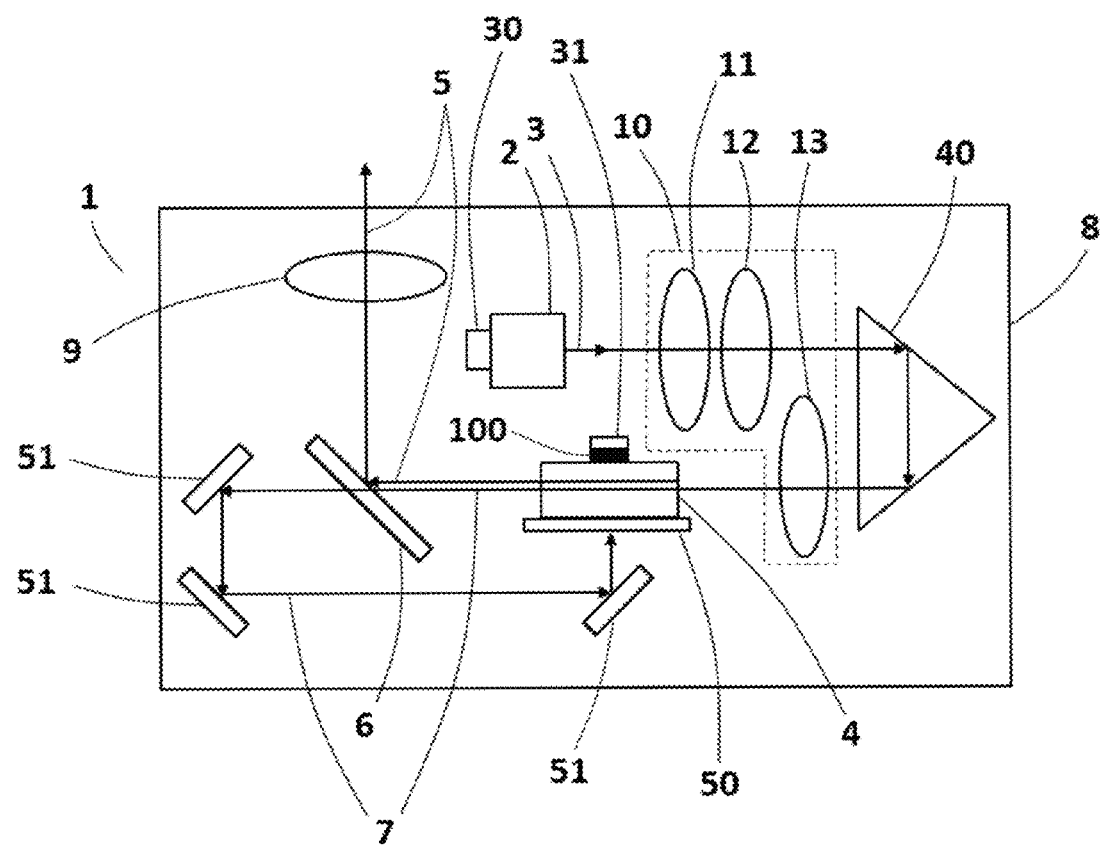
FIG. 20 shows an exemplary laser device according to an aspect of this invention which includes a light absorbing component to heat the nonlinear optical component.

A third example of this invention is now disclosed. The third example is similar to the second example and common features may not be repeated. In this third example, which is illustrated in FIG. 20, the device 1 includes a light absorbing component 50 which partially or fully absorbs light with the wavelength of the source light 3 emitted by the laser light source 2. The light absorbing component 50 is attached to the nonlinear optical component 4, or alternatively it may be attached to the housing 8 close to, or otherwise in thermal contact with, the nonlinear optical component.

The light absorbing component 50 may be a coating of a light absorbing material applied to the nonlinear optical component or housing, such as for example a metal oxide layer applied by anodising or painting. The component may be a separate piece which is attached to the nonlinear optical component 4 or housing 8, for example by using a screw and an optional heat transfer compound or by using an adhesive. Suitable heat transfer compounds may be metal oxide heat transfer compounds and silicone heat transfer compounds. Suitable adhesives may be epoxy adhesives, cyanoacrylates and UV curing adhesives. The adhesive may be a thermally conductive adhesive. In this example the light absorbing part is an anodised aluminium piece which is in physical contact with the nonlinear optical component 4 and attached to the housing using a UV curing adhesive.

The housing 8 may optionally include one or more parts which increase the thermal resistance between the light absorbing component 50 and the laser light source 2. The housing may optionally include one or more parts which increase the thermal resistance between the light absorbing component and a heat sink. The optional one or more parts are preferably made from a material which has a thermal conductivity less than 10 W·m$^{-1}$·K$^{-1}$ and more preferably less than 0.5 W·m$^{-1}$K$^{-1}$. In this example the housing includes a component 100 which is constructed from ABS plastic which has a thermal conductivity of approximately 0.2 W·m$^{-1}$·K$^{-1}$ and is attached to the aluminium housing using a UV curing adhesive. The ABS component 100 is positioned between the nonlinear optical component 4 and both the laser light source and the heat sink and is a dominant factor in determining the thermal resistance between both the light absorbing region and the laser light source and the light absorbing region and the heat sink.

The residual light 7 propagating out of the nonlinear optical component 4 may be made incident on the light absorbing component 50 through the optional use of one or more additional optics 51, for example mirrors. These optional additional optics may be disposed at any of the following locations in the path of the residual light 7 beam: between the nonlinear optical component 4 and the filter 6; within the filter 6; between the filter 6 and the light absorbing component 50. For example, three mirrors may be positioned in the path of the residual light 7 beam between the filter 6 and the light absorbing component 50, as shown in FIG. 20. Each mirror reflects the fundamental beam through an angle of 90° so that the beam is made incident on the light absorbing component. Some or all of the light incident on the light absorbing part is converted into heat, increasing the temperature of the nonlinear optical component. The ABS component 100 reduces the amount of heat which reaches the laser light source 2 and the heat sink from the light absorbing component.

Example 4: Component to Reduce Change in Beam Direction and/or Position

Figure 21:
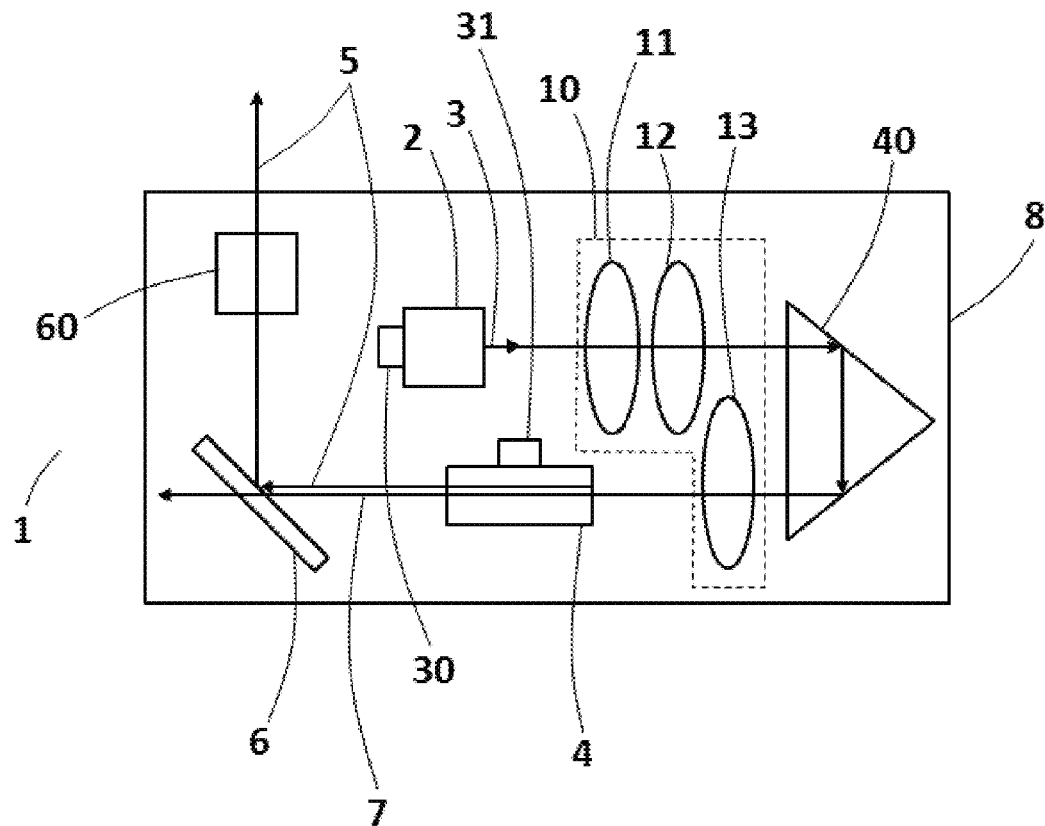
FIG. 21 shows an exemplary laser device according to an aspect of this invention which includes one or more optical components which stabilise the position and/or direction of the output light beam.

A fourth example of this invention is now disclosed. The fourth example is similar to the first example and common features may not be repeated. In this fourth example, which is illustrated in FIG. 21, the device 1 includes one or more optical components 60 which reduce the variation in direction or position of the output light beam 5 when operating conditions are changed. As described above, a variation in the operating conditions of a device according to any of the other examples in this disclosure may result in a change in the direction of the frequency-converted output light (e.g. second harmonic light) propagating out of the nonlinear optical component 4, for example if any change in operating condition causes a change in the wavelength of the source light 3 emitted by the laser light source 2. Experimental data showing this effect is displayed in FIG. 13. This data shows that the position of the frequency-converted output light, measured on a CCD beam profiler located a distance of approximately 8 cm from the nonlinear optical component (measured along the propagation direction of the output light) changed when the wavelength of the source light 3 emitted by the laser light source 2 was changed. The change in position of the beam on the CCD beam profiler corresponds to approximately a 0.5° change in the direction of the output beam for source light with wavelength 447.9 nm compared to the direction of the output beam for source light with wavelength 449.6 nm. The wavelength of the source light 3 emitted by the laser light source 2, may change due to at least one of a change in the electrical current supplied to the laser light source, a change in the operating mode of the laser light source (such as a change in duty cycle of pulse operation or a change between pulsed operation and continuous operation), and a change in the temperature of the laser light source. Further experiments by the present inventors have determined that the direction of the output beam may also change when the temperature of the nonlinear optical component is changed. Using the same experimental configuration as described for FIG. 13, the wavelength of the laser light source was configured to be approximately 448 nm, and the temperature of a β-BaB$_2$O$_4$ crystal (the nonlinear optical component) was changed. The direction of the frequency-converted (second harmonic) output beam propagating from the nonlinear optical component was found to change by approximately 0.01° per Kelvin change in temperature of the β-BaB$_2$O$_4$ crystal.

A variation in the direction of the output light may be a significant disadvantage for applications of a device. For example, if the output light from a device is coupled into an optical system then a change in the direction of the output beam (caused by a change in the operating condition of the device) may render the optical system inoperable. For example, if the output light is used in an optical system which is configured to measure the absorption of the output light as it propagates through an analyte by using a detection component to measure the power of the output light which has propagated through the analyte, a change in the direction of the output light from the device may cause the output light to propagate towards a location away from the detection component, and therefore make the optical system inoperable or unreliable.

Figure 14:
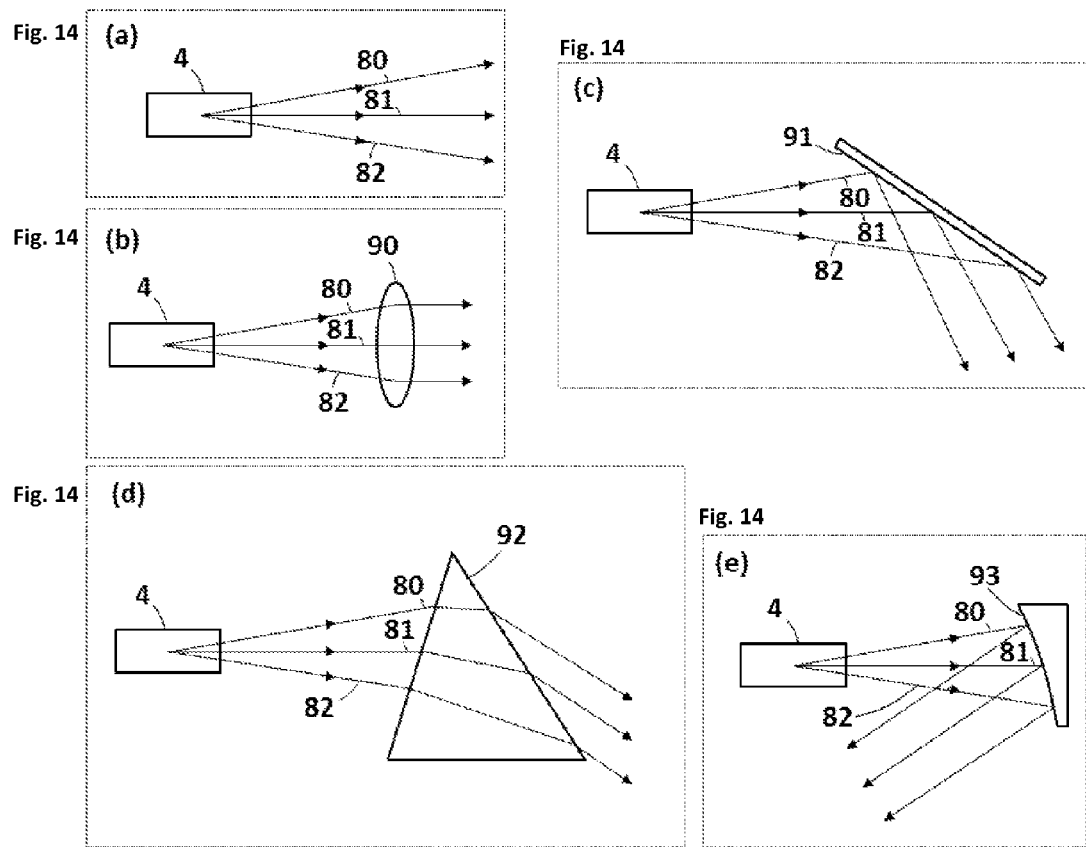
FIG. 14(a), FIG. 14(b), FIG. 14(c), FIG. 14(d), and FIG. 14(e) show schematic diagrams of output light propagating out of the nonlinear optical component at three different operating conditions and the effects of various beam stabilising optical components on the direction of the output light.

In this fourth example, one or more optical components 60 are used to reduce the dependence of the direction of the output beam on the operating conditions of the device. The one or more optical components 60 may include a lens which is configured to reduce the variation in direction of the output beam. A lens located a distance, measured from the centre of the nonlinear optical component 4 along the propagation direction of the output beam, approximately equal to the effective focal length of said lens may reduce the variation in direction of the output beam, as illustrated in FIG. 14 (b) wherein the output light propagating in directions labelled 80, 81, 82 are deflected as they propagate through the lens such that after propagation through the lens their directions are preferably approximately parallel.

The lens 9 described in the first example may be configured to provide this effect (in which case the lens 9 is an example of an optical component 60). Although the variation in the direction of the output beam is reduced by said lens, the spatial position of the output beam is still dependent on operating conditions. If optical component 60 is a lens with effective focal length of approximately 30 mm, a variation in direction of the output beam 5 of 0.5° (as seen in FIG. 13), which corresponds to a change in spatial position of the output beam after propagation through the lens of approximately 260 μm. This change in spatial position may be reduced by including the one or more additional optical components 60 to act on the output beam 5. For example, a beam reducer (a beam expander used in reverse, i.e. to decrease the spot size of the output beam) may be used, whereby the reduction in variation of the output beam is then equal to the demagnification of the beam reducer. An example of a beam reducer is a piano-convex spherical lens with a focal length of f=30 mm followed by a biconcave spherical lens with a focal length of f=−6 mm arranged in a Galilean configuration. This results in a demagnification of ×5, and therefore reduces the magnitude of the spatial variation by a factor of five. The one or more optical components 60 may be disposed along the propagation direction of the output beam before and/or after the filter 6. In the case that two or more optical components are used, optical components may be placed both before and after the filter. Any of the one or more additional optical components may be the same optical components as the one or more optical components which comprise the filter.

Optical components 60 to reduce the variation in direction of the output beam in this fourth example may also include at least one of a diffraction grating, a prism and a concave mirror (for example with hyperbolic shape) as well as or instead of the lens.

Example 5: Laser with Wavelength Stabilising Component

Figure 22:
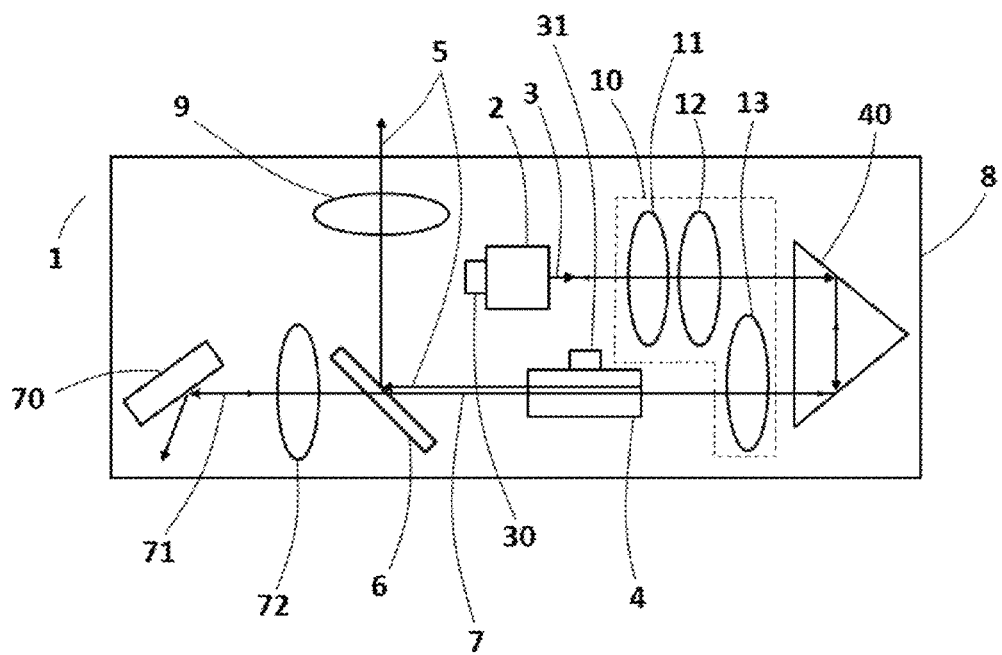
FIG. 22 shows an exemplary laser device according to an aspect of this invention which includes a wavelength stabilising component.

A fifth example of this invention is now disclosed. The fifth example is similar to the second example and common features may not be repeated. In this fifth example, which is illustrated in FIG. 22, the laser device 1 includes a wavelength stabilising component 70. The wavelength stabilising component 70 is configured to reduce a variation in the wavelength of the source light 3 emitted from the laser light source 2 when operating conditions are changed.

In this example the wavelength stabilising component is a surface diffraction grating, preferably a holographic diffraction grating, with a surface including an aluminium layer and with 3600 lines per mm. However, similar performance may be obtained using a grating with a different number of lines per mm, a grating with a different surface material layers (e.g. silver) or a different grating type (e.g. a ruled diffraction grating or volume Bragg grating). Furthermore, similar performance may be obtained using a dichroic mirror or a band-pass filter combined with a mirror to reflect a narrow range of wavelengths back towards the laser light source 2, which in this example is the same laser diode as described in the first example.

The surface diffraction grating is arranged in a "Littrow" external cavity diode laser configuration. Some or all of the residual light 7 is incident on the surface diffraction grating and this light is referred to as incident light 71. The surface diffraction grating is orientated so that the incident light 71 is diffracted through preferably a first order diffraction (although higher order diffraction may be used) and some of the diffracted light propagates back towards the laser diode along the same path that the light emitted from the laser diode propagated towards the surface diffraction grating, but in the opposite direction. The diffracted light which propagates to the laser diode causes the laser diode to preferentially emit a wavelength similar to the wavelength of said light. The wavelength of the diffracted light which propagates to the laser diode is dependent on the orientation of the surface diffraction grating. For a surface diffraction grating with 3600 lines per mm the angle of incidence of the light onto the surface diffraction grating is approximately 54.1° for a wavelength of 450 nm. The wavelength of the diffracted light which propagates to the laser diode does not strongly depend on the operating conditions of the laser diode. Therefore, the diffracted light acts to stabilise the wavelength of light emitted by the laser diode, $\lambda_{peak,\ source}$, against variations caused by changes in an operating condition, e.g. change in ambient temperature, change in current and/or voltage supplied to the laser diode, change in duty cycle of pulsed operation of the laser diode, change between pulsed operation and continuous operation of the laser diode. Thus, the wavelength mismatch error for the frequency conversion process (second harmonic generation in this example) may be reduced, compared with a device which does not include a wavelength stabilising component, thereby enabling a larger operable range for the device 1 with respect to operating conditions than for a device which does not include a wavelength stabilising component. Additionally, the wavelength of the output light 5 of the laser device 1, $\lambda_{peak,\ output}$, may be also stabilised against changes in operating conditions because $\lambda_{peak,\ output}$ is dependent on $\lambda_{peak,\ source}$. This may also provide a wider operable range for the laser device, for example in applications where it is unacceptable for the wavelength of the output light to vary significantly.

In this example, as illustrated in FIG. 22, the light emitted by the laser diode is incident on the nonlinear optical component 4 and on the filter 6 before it is incident on the wavelength stabilising component 70, and then the diffracted beam which propagates back to the laser diode is also incident on the filter and nonlinear optical component before reaching the laser diode. One or more optical components 72 may be added to collimate or focus the residual light 7 to form the incident light 71 which is incident on the surface diffraction grating. Preferably the incident light 71 forms a waist at the surface diffraction grating. A suitable optic for the optical component 72 may be a spherical lens with a focal length between 5 mm and 200 mm, preferably between 30 mm and 150 mm. Alternatively, a suitable system includes two cylindrical lenses each with a focal length between 5 mm and 200 mm wherein the first cylindrical lens focuses light in a first plane and the second lens focuses light in a second plane which is perpendicular to the first plane. The focal lengths of the two cylindrical lenses may be different. The one or more optics may be the same one or more optical components 9 in the first example for collimating the output light 5 but this need not be the case. In this example the optical component 72 is a spherical lens. Some or all of the specular reflection (zero-order diffraction) of the incident light 71 from the diffraction grating may be used to heat the nonlinear optical component 4 as described in the third example. The portion of the power of the incident light 71 which is diffracted in the diffracted light at the surface diffraction grating may be in the range 1% to 99% and is preferably in the range 50% to 99% for this example.

A laser device 1 has been constructed according to this fifth example. The device is comparable to the device 1 described in the second example unless noted otherwise. A surface diffraction grating (holographic diffraction grating with 3600 lines per mm) was used as a wavelength stabilising component 70, and a spherical lens with an effective focal length of 30 mm (for wavelength of λ=588 nm) was used as an optical component 72, as shown in FIG. 22. The surface diffraction grating was permanently attached to the housing 8 with an orientation such that the incident light 71 was diffracted (first-order diffraction) along the optical path back towards the laser diode. In this configuration the light emitted by the laser diode had a peak wavelength $\lambda_{peak,\ source}$ of ≈447.1 nm, and the variation in emission wavelength with ambient temperature was approximately 0.005 nm·K$^{-1}$.

In an alternative configuration for this example (not shown in FIG. 22), the wavelength stabilising component 70 may be disposed on the optical path between the laser light source 2 and the nonlinear optical component 4. For example, the wavelength stabilising component may be a surface diffraction grating which is disposed so that light emitted by the laser diode is substantially collimated by a collimating lens 11 and is then incident on said surface diffraction grating. In this configuration the portion of the power of the light which is incident on the surface diffraction grating which is diffracted as diffracted light back towards the laser diode (e.g. in the first order of diffraction) may be in the range 1% to 99%, but is preferably in the range 5% to 20% for this example. The specular reflection (zero-order diffraction) of the light which is incident on the surface diffraction grating then interacts with the focusing optics (e.g. first and second cylindrical lenses 12,13) and passes into the nonlinear optical component 4 to generate the frequency converted output light 5.

An aspect of the invention, therefore, is a laser device. In exemplary embodiments, the laser device includes a light source configured to emit a source light having a first peak wavelength, and a nonlinear optical component configured to perform a frequency conversion process that converts at least a portion of the source light into output light having a second peak wavelength different from the first peak wavelength. The laser device includes a stabilization component configured to minimize a mismatch error constituting a difference between the first peak wavelength of the source light and a wavelength for which the frequency conversion process in the nonlinear optical component has a maximum value. The stabilization component includes a housing that houses the light source and the nonlinear optical component. The laser device may include one or more of the following features, either individually or in combination.

In an exemplary embodiment of the laser device, the housing is thermally conductive between the light source and the nonlinear optical component to minimize a temperature difference between the light source and the nonlinear optical component.

In an exemplary embodiment of the laser device, a distance between attachment points of the light source and the nonlinear optical component to the housing is less than 200 mm.

In an exemplary embodiment of the laser device, a thermal conductivity of material of the housing between the laser light source and the nonlinear optical component is at least 10 $W \cdot m^{-1} \cdot K^{-1}$.

In an exemplary embodiment of the laser device, a heat capacity of the housing between the laser light source and the nonlinear optical component is less than 500 $J \cdot K^{-1}$.

In an exemplary embodiment of the laser device, a heat capacity of the nonlinear optical component is less than 0.1 $J \cdot K^{-1}$.

In an exemplary embodiment of the laser device, the laser device further includes a heat sink within the housing.

In an exemplary embodiment of the laser device, the output light includes residual light having the first peak wavelength of the source light. The laser device further includes an optical component configured to direct the residual light to act as a heat source for heating the nonlinear optical component as part of minimizing the mismatch error.

In an exemplary embodiment of the laser device, the laser device further includes an absorbing component in thermal contact with the nonlinear optical component, wherein optical component directs the residual light onto the absorbing component and the absorbing component absorbs the residual light.

In an exemplary embodiment of the laser device, the laser device further includes a filter that spatially separates the residual light from the portion of the output light having the second peak wavelength.

In an exemplary embodiment of the laser device, the laser device further includes a focusing optical component that focuses the source light. The focusing optical component is configured to focus the source light to have a first convergence half angle that is larger than a second convergence half angle that gives maximum output power.

In an exemplary embodiment of the laser device, the light source is configured to emit source light having a spectral linewidth of at least 0.5 nm.

In an exemplary embodiment of the laser device, the laser device further includes a beam stabilization optical component is configured to stabilize a direction and/or position of the output light.

In an exemplary embodiment of the laser device, the beam stabilization optical component comprises at least one of a lens, a diffraction grating, a prism, or a mirror.

In an exemplary embodiment of the laser device, the stabilization component includes a wavelength stabilizing component configured to reduce a variation of the first peak wavelength of the source light.

In an exemplary embodiment of the laser device, the wavelength stabilizing component comprises a diffraction grating.

In an exemplary embodiment of the laser device, the laser device is configured to have an operable range of ±10° C.

In an exemplary embodiment of the laser device, the nonlinear optical component is a frequency doubling component whereby the first peak wavelength of the source light is double the second peak wavelength of the output light.

In an exemplary embodiment of the laser device, the first peak wavelength is within a range from 400 nm to 600 nm, the second peak wavelength is within a range from 200 nm to 300 nm, and the light source is a laser diode.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

Optionally, the device may also be arranged such that embodiments of the invention may be utilized in just a part or sub-array of the entire device. Optionally, some or all of the multiple different embodiments may be utilized in different rows columns or regions of the device.

INDUSTRIAL APPLICABILITY

A laser device in accordance with the present invention may be used as a deep ultraviolet light source. Said light sources may be used in fluorescence sensors or absorption sensors.

What is claimed is:

1. A laser device comprising:
a light source configured to emit a source light having a first peak wavelength;
a nonlinear optical component configured to perform a frequency conversion process that converts at least a portion of the source light into output light having a second peak wavelength different from the first peak wavelength; and
a focusing optical component that focuses the source light;

wherein the light source and the nonlinear optical component are passively thermally conductive with each other such that a change in temperature of the light source results in a change in temperature of the nonlinear optical component, thereby minimizing a mismatch error constituting a difference between the first peak wavelength of the source light and a wavelength for which the frequency conversion process in the nonlinear optical component has a maximum value;

wherein the laser device further includes a housing that houses the light source and the nonlinear optical component;

wherein the focusing optical component is configured to focus the source light to have a first convergence half angle that is larger than a second convergence half angle that gives maximum output power of output light having the second peak wavelength; and wherein the light source is configured to emit source light having a spectral linewidth of at least 0.5 nm.

2. The laser device of claim 1, wherein the housing is thermally conductive between the light source and the nonlinear optical component to minimize a temperature difference between the light source and the nonlinear optical component.

3. The laser device of claim 2, wherein a distance between attachment points of the light source and the nonlinear optical component to the housing is less than 200 mm.

4. The laser device of claim 2, wherein a thermal conductivity of material of the housing between the laser light source and the nonlinear optical component is at least 10 $W \cdot m^{-1} \cdot K^{-1}$.

5. The laser device of claim 2, wherein a heat capacity of the housing between the laser light source and the nonlinear optical component is less than 500 $J \cdot K^{-1}$.

6. The laser device of claim 2, wherein a heat capacity of the nonlinear optical component is less than 0.1 $J \cdot K^{-1}$.

7. The laser device of claim 2, further comprising a heat sink within the housing.

8. The laser device of claim 1, wherein the output light includes residual light having the first peak wavelength of the source light;

the laser device further comprising an optical component configured to direct the residual light to act as a heat source for heating the nonlinear optical component as part of minimizing the mismatch error.

9. The laser device of claim 8, further comprising an absorbing component in thermal contact with the nonlinear optical component, wherein optical component directs the residual light onto the absorbing component and the absorbing component absorbs the residual light.

10. The laser device of claim 8, further comprising a filter that spatially separates the residual light from the portion of the output light having the second peak wavelength.

11. The laser device of claim 1, further comprising a beam stabilization optical component configured to stabilize a direction and/or position of the output light.

12. The laser device of claim 11, wherein the beam stabilization optical component comprises at least one of a lens, a diffraction grating, a prism, or a mirror.

13. The laser device of claim 1, further comprising a wavelength stabilizing component configured to reduce a variation of the first peak wavelength of the source light.

14. The laser device of claim 13, wherein the wavelength stabilizing component comprises a diffraction grating.

15. The laser device of claim 1, wherein the laser device is configured to have an operable range of ±10° C.

16. The laser device of claim 1, wherein the nonlinear optical component is a frequency doubling component whereby the first peak wavelength of the source light is double the second peak wavelength of the output light.

17. The laser device of claim 16, wherein the first peak wavelength is within a range from 400 nm to 600 nm, the second peak wavelength is within a range from 200 nm to 300 nm, and the light source is a laser diode.

* * * * *